US012762888B2

(12) United States Patent
Hu et al.

(10) Patent No.: US 12,762,888 B2
(45) Date of Patent: Oct. 13, 2026

(54) FINGER FEATURE MODULE

(71) Applicant: Darfon Electronics Corp., Taoyuan City (TW)

(72) Inventors: Tsai-Jung Hu, Taoyuan City (TW); Chun-Tan Wu, Taoyuan City (TW); Tien-Szu Chen, Taoyuan City (TW)

(73) Assignee: DARFON ELECTRONICS CORP., Taoyuan City (TW)

( * ) Notice: Subject to any disclaimer, the term of this patent is extended or adjusted under 35 U.S.C. 154(b) by 0 days.

(21) Appl. No.: 19/059,393

(22) Filed: Feb. 21, 2025

(65) Prior Publication Data

US 2025/0265866 A1 Aug. 21, 2025

Related U.S. Application Data

(60) Provisional application No. 63/658,535, filed on Jun. 11, 2024, provisional application No. 63/645,229, filed on May 10, 2024, provisional application No. 63/555,921, filed on Feb. 21, 2024.

(30) Foreign Application Priority Data

Feb. 21, 2025 (TW) ................................ 114106399

(51) Int. Cl.
*H05K 1/14* (2006.01)
*G06V 40/13* (2022.01)

(52) U.S. Cl.
CPC ......... *G06V 40/1318* (2022.01); *H05K 1/147* (2013.01)

(58) Field of Classification Search
CPC .......................... G06V 40/1318; H05K 1/147
See application file for complete search history.

(56) References Cited

U.S. PATENT DOCUMENTS

| | | | | |
|---|---|---|---|---|
| 7,200,288 | B2 | 4/2007 | Ogura | |
| 8,903,140 | B2 | 12/2014 | Wu | |
| 9,824,253 | B2 | 11/2017 | Lin | |
| 10,372,964 | B2 | 8/2019 | Lu | |
| 10,803,287 | B2 | 10/2020 | Wu | |
| 11,875,591 | B2 | 1/2024 | Lee | |
| 2013/0307818 | A1* | 11/2013 | Pope | G06V 40/1306 345/174 |

(Continued)

FOREIGN PATENT DOCUMENTS

| | | | |
|---|---|---|---|
| CN | 1424693 | B | 4/2010 |
| CN | 204613976 | U | 9/2015 |

(Continued)

*Primary Examiner* — Antonio Xavier

(74) *Attorney, Agent, or Firm* — McClure, Qualey & Rodack, LLP

(57) ABSTRACT

A finger feature module includes a light guide seat including a frame and a plate body disposed in the frame and having an eccentrically disposed through hole, a circuit board assembly having a first portion disposed in the frame and located above the plate body and a second portion passing through the through hole to be at least partially located below the plate body, a feature sensor on the first portion of the circuit board assembly, and a plurality of illuminants electrically connected to the circuit board assembly, wherein two of the illuminants are located at two opposite ends of the through hole, and a virtual connecting line of the two illuminants overlaps the through hole.

19 Claims, 16 Drawing Sheets

(56) References Cited

U.S. PATENT DOCUMENTS

| | | | | | |
|---|---|---|---|---|---|
| 2023/0245489 | A1 * | 8/2023 | Lee | .................... | G06V 40/1306<br>382/124 |

FOREIGN PATENT DOCUMENTS

| | | | |
|---|---|---|---|
| CN | 204631898 | U | 9/2015 |
| CN | 207764818 | U | 8/2018 |
| CN | 207924694 | U | 9/2018 |
| CN | 109711235 | B | 5/2019 |
| CN | 211788758 | U | 10/2020 |
| CN | 213958070 | U | 8/2021 |
| CN | 214384658 | U | 10/2021 |
| CN | 214751915 | U | 11/2021 |
| CN | 218273432 | U | 1/2023 |
| CN | 218413520 | U | 1/2023 |
| CN | 218730543 | U | 3/2023 |
| JP | 2011180973 | A | 9/2011 |
| JP | 6055038 | B1 | 12/2016 |
| JP | 6026606 | B1 | 3/2017 |
| TW | I382349 | B | 7/2010 |
| TW | M544048 | U | 6/2017 |
| TW | I649696 | B | 7/2018 |
| TW | M621518 | U | 12/2021 |
| TW | M632311 | U | 9/2022 |
| TW | 202336636 | A | 9/2023 |
| TW | I834174 | B | 3/2024 |

* cited by examiner

FINGER FEATURE MODULE

CROSS-REFERENCE TO RELATED APPLICATION

This application claims the priority benefits of Taiwan patent application serial No. 114106399, filed on Feb. 21, 2025, and also claims the priority benefits of U.S. provisional application Ser. No. 63/555,921, filed Feb. 21, 2024, U.S. provisional application Ser. No. 63/645,229, filed May 10, 2024, and U.S. provisional application Ser. No. 63/658,535, filed Jun. 11, 2024. The entirety of the mentioned above patent applications is hereby incorporated by reference herein and made a part of this specification.

BACKGROUND OF THE INVENTION

1. Field of the Invention

The invention generally relates to a finger feature module. Particularly, the invention relates to a finger feature module having a light guide seat designed with an eccentrically disposed hole.

2. Description of the Prior Art

When the finger feature module is disposed on the keyboard/housing of the electronic device, the top of the finger feature module has a key-like appearance, and the overall structural design must be highly integrated to meet the specification requirements of modern electronic devices. In order to address multiple process and functional requirements, the finger feature module design is a complex problem with no simple answers. When the finger feature module also needs to provide the keyswitch function, such as serving as a power keyswitch or a certain function key, the design difficulty is further increased.

SUMMARY OF THE INVENTION

It is an object of the invention to provide a finger feature module, wherein the light guide seat has an eccentrically disposed through hole, which facilitates the arrangement of circuit boards and reduces the possibility of components peeling off.

It is another object of the invention to provide a finger feature module, wherein the light guide seat is formed by multiple parts, facilitating the processability and manufacturability.

It is yet another object of the invention to provide a finger feature module, wherein the light guide seat has the accommodation space divided into the upper room and the lower room, enhancing the arrangement flexibility of circuit boards.

In an embodiment, the invention provides a finger feature module including a light guide seat including a frame and a plate body, the plate body disposed in the frame and having a through hole eccentrically disposed, a circuit board assembly having a first portion and a second portion, the first portion of the circuit board assembly disposed in the frame and located above the plate body, the second portion of the circuit board assembly passing through the through hole to be at least partially located below the plate body, a feature sensor disposed on the first portion of the circuit board assembly, and a plurality of illuminants electrically connected to the circuit board assembly, wherein two of the plurality of illuminants are located at two opposite ends of the through hole, and a virtual connection line of the two of the plurality of illuminants overlaps the through hole.

In an embodiment, the plate body is connected to a middle section of the frame to define an upper room and a lower room in the frame. The upper room and the lower room are respectively above and below the plate body. The through hole communicates the upper room with the lower room.

In an embodiment, the circuit board assembly includes a first circuit board located in the upper room and a second circuit board located in the lower room.

In an embodiment, the plate body is disposed with a plurality of illuminant receiving portions. The plurality of illuminants are respectively disposed in the plurality of illuminant receiving portions.

In an embodiment, the plate body includes an immovable board and a removable board. The immovable board extends from the frame toward the center of the frame to form an opening in the frame. The removable board partially covers the opening to define the through hole with the immovable board.

In an embodiment, the plate body further has a central slot. The central slot communicates with the through hole. The major axis of the central slot is perpendicular to the major axis of the through hole.

In an embodiment, the plate body further has an expanded slot. The expanded slot extends outward from where the central slot and the through hole intersect.

In another embodiment, the invention provides a finger feature module including a light guide seat including a frame and a removable board, the removable board removably disposed in the frame to define a through hole, a circuit board assembly having a first portion and a second portion, the first portion of the circuit board assembly disposed in the frame and located above the removable board, the second portion of the circuit board assembly passing through the through hole to be at least partially located below the removable board, a feature sensor disposed on the first portion of the circuit board assembly, and one or more illuminants electrically connected to the circuit board assembly to emit light toward the light guide seat.

In an embodiment, the frame has an immovable board. The immovable board extends from the frame toward a center of the frame to form an opening in the frame. The removable board partially covers the opening, so that a portion of the opening not covered by the removable board forms the through hole.

In an embodiment, the center of the frame is in the opening. The removable board partially covers the opening to cover the center of the frame, so that the through hole is eccentrically disposed with respect to the center of the frame.

In an embodiment, the portion of the opening not covered by the removable board further forms one or more illuminant receiving portions.

In an embodiment, the immovable board has two first illuminant receiving portions disposed at two ends of the through hole. Each of the two first illuminant receiving portions is configured to accommodate at least one of the illuminants.

In an embodiment, the removable board has a second illuminant receiving portion. The second illuminant receiving portion and the through hole are located at two opposite sides of the frame with respect to the center of the frame. The second illuminant receiving portion is configured to accommodate at least one of the illuminants.

In an embodiment, the circuit board assembly includes a first circuit board and a second circuit board. The first circuit board is located on the first portion of the circuit board assembly and covers the through hole. The second circuit board is located on the second portion of the circuit board assembly and retreats with respect to the first circuit board to form a retreat space.

In an embodiment, the circuit board assembly includes a flexible printed circuit board configured to carry the first circuit board and the second circuit board. The flexible printed circuit board has a bending section passing through the through hole. The bending section is located in the retreat space.

In an embodiment, the bending section is spaced apart from a sidewall of the frame by a distance. The distance is 10% to 45% of a width of the first circuit board.

In an embodiment, the circuit board assembly includes a rigid board and a flexible printed circuit board. The rigid board is located on the first portion of the circuit board assembly. The flexible printed circuit board is configured to carry the rigid board. The feature sensor is disposed on and electrically connected to the flexible printed circuit board. The feature sensor at least partially overlaps the rigid board with the flexible printed circuit board therebetween.

In an embodiment, the circuit board assembly includes a flexible printed circuit board, a first circuit board, and a second circuit board. The first circuit board and the second circuit board are respectively disposed on the upper side and the lower side of the flexible printed circuit board. An end portion of the first circuit board has a gap with the flexible printed circuit board. The second circuit board retreats with respect to the end portion of the first circuit board.

In an embodiment, the circuit board assembly further includes an interposed circuit board. The interposed circuit board is located between the first circuit board and the flexible printed circuit board. The interposed circuit board retreats with respect to the first circuit board to form the gap.

In yet another embodiment, the invention provides a finger feature module including a light guide seat including a frame and a plate body, the frame defining an accommodation space, the plate body disposed in the frame to divide the accommodation space into an upper room and a lower room, the plate body having a through hole communicating the upper room with the lower room, a circuit board assembly including a flexible printed circuit board, a first circuit board, and a second circuit board, the first circuit board and the second circuit board disposed on the flexible printed circuit board, the flexible printed circuit board extending through the through hole from the upper room to the lower room, the first circuit board located in the upper room, the second circuit board located in the lower room, a feature sensor disposed on the first circuit board, and an illuminant electrically connected to the circuit board assembly to emit light toward the light guide seat.

In an embodiment, the first circuit board covers the through hole, and the second circuit board retreats with respect to the first circuit board.

In an embodiment, the finger feature module further includes a base holder. The base holder is configured to support the light guide seat. The base holder is provided with an opening at bottom. The circuit board assembly extends to outside of the base holder from the opening.

In an embodiment, the circuit board assembly further includes a switch. The switch is exposed from the opening, so that the finger feature module has a keyswitch function.

In an embodiment, the flexible printed circuit board has a slit to define a first flexible part, a second flexible part, and a bending section connected between the first flexible part and the second flexible part. The first circuit board and the second circuit board are respectively disposed on the first flexible part and the second flexible part. The flexible printed circuit board is bent relative to the slit to form the bending section.

In an embodiment, before the flexible printed circuit board is bent, the first flexible part has a pair of flexible wings at two opposite sides of the bending section.

In an embodiment, the illuminant is disposed on the flexible printed circuit board.

Compared with the prior art, the finger feature module of the invention has an eccentrically disposed through hole on the light guide seat, which facilitates the stack configuration of multiple circuit boards and reduces the possibility of illuminants or circuit components peeling off. Moreover, the finger feature module of the invention has the light guide seat formed by multiple parts, facilitating the manufacturability and the assembly operation. In addition, the light guide seat of the finger feature module of the invention has separated upper room and lower room to enhance the arrangement flexibility of circuit boards.

DETAILED DESCRIPTION OF THE PREFERRED EMBODIMENT

In the finger feature module, flexible printed circuit boards (FPCs) are often used to carry signal circuits between multiple circuit boards. However, due to the size limitation of the finger feature module itself, the flexible printed circuit boards must be bent to successfully connect multiple circuit boards which are vertically stacked. In general, if the flexible printed circuit board needs to be bent, the substrate of the light source and the light source driving circuit will encounter problems, because the stress difference near the bending section of the flexible printed circuit board is large, which can easily cause the light source or circuit components on the flexible printed circuit board to peel off. The feature sensor, the flexible printed circuit board and multiple rigid circuit boards need to be installed together in the base holder. When the bending section of the flexible printed circuit board is located at or exceeds the side edge of the finger feature unit (such as the feature sensor), the bending section is easy to be squeezed and collided during the production line or non-production line, causing damage to the circuit or components. In addition, the finger feature module further includes a light guide seat, which has an upright sidewall that can laterally surround the finger feature unit. However, if there is a defect in the entire sidewall, or the cross-sectional area, shape, or size in any direction is inconsistent, such as a flexible printed circuit board passing through a side of the sidewall, it will cause a difference in the brightness of the light emitted from the top surface of the light guide seat. The stacking design of multiple rigid circuit boards and the flexible circuit printed board in the finger feature module affects the difficulty, cost and throughput per unit time of the process.

Figure 1A:
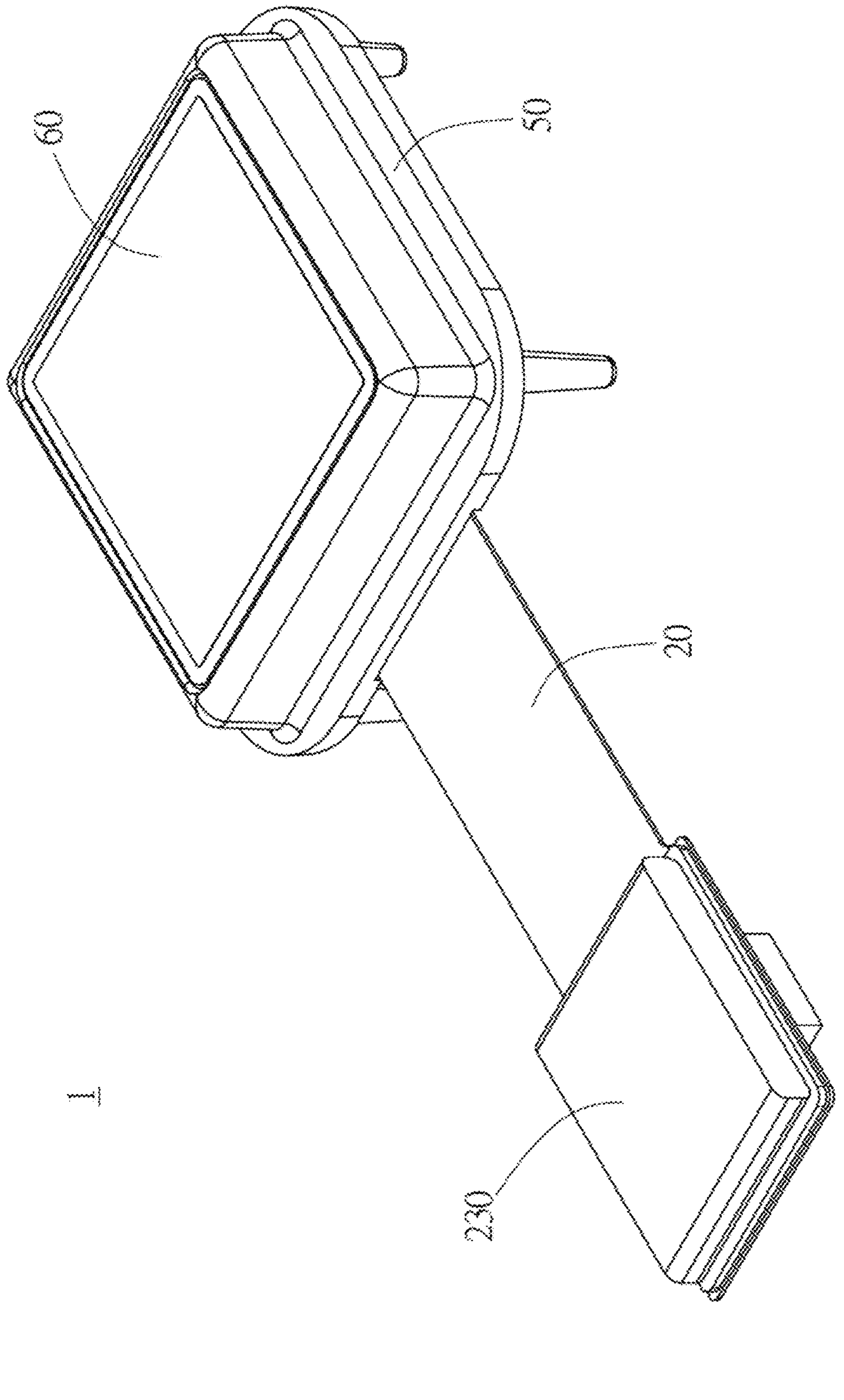
FIGS. 1A and 1B are respectively a perspective view and an exploded view of the finger feature module in a first embodiment of the invention.
Figure 1B:
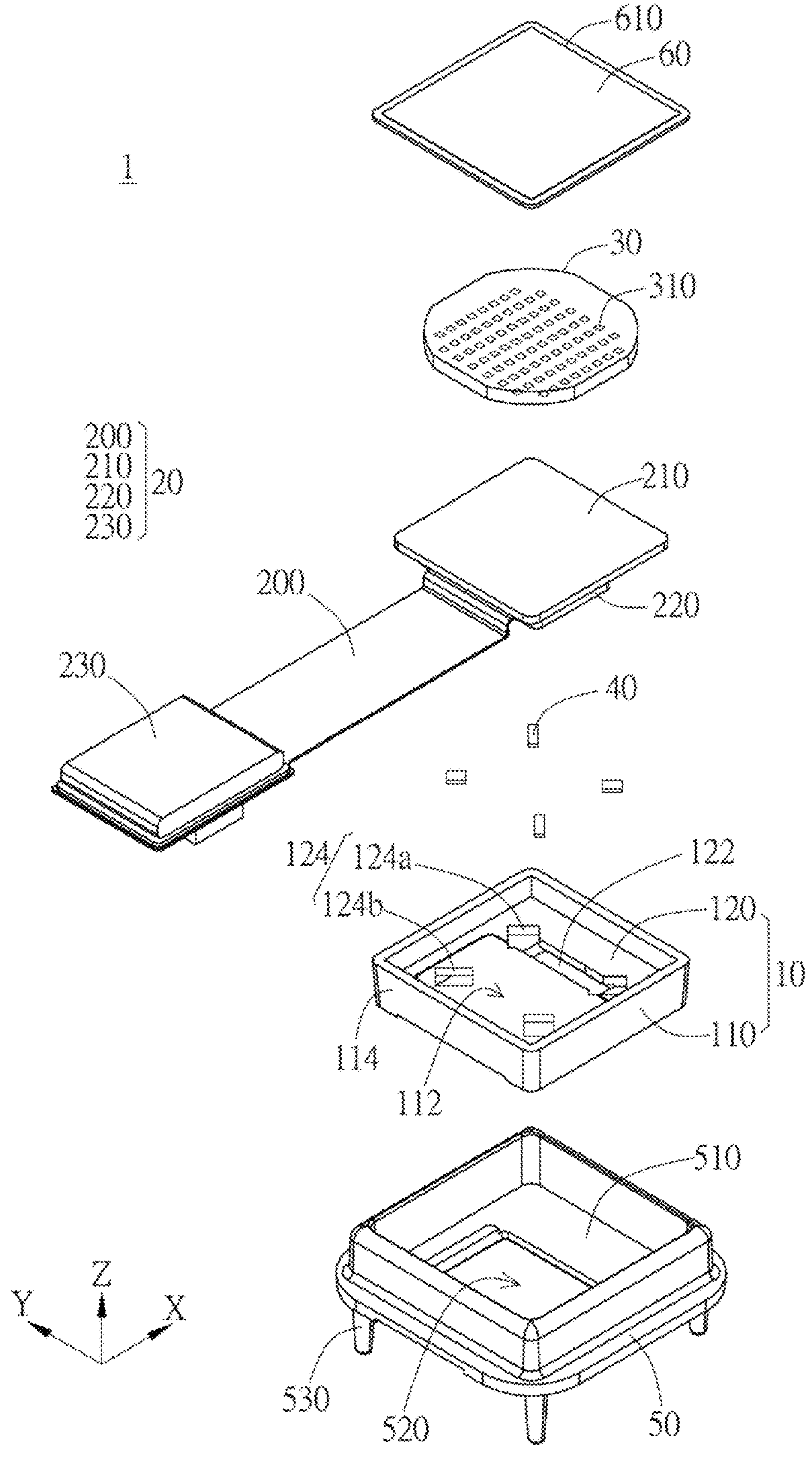
Figure 1C:
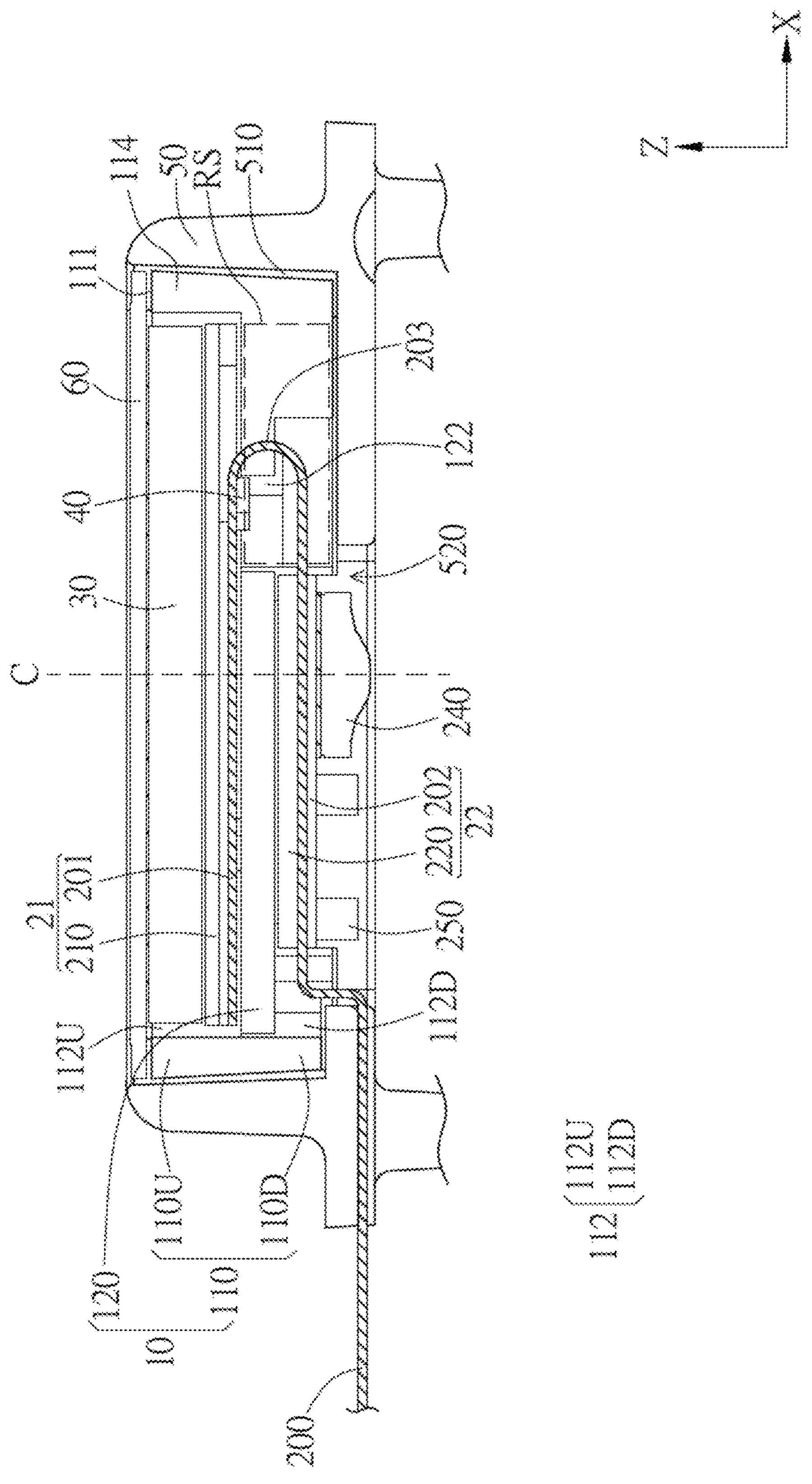
FIG. 1C is a partial cross-sectional view of the finger feature module of FIG. 1A.
Figure 3A:
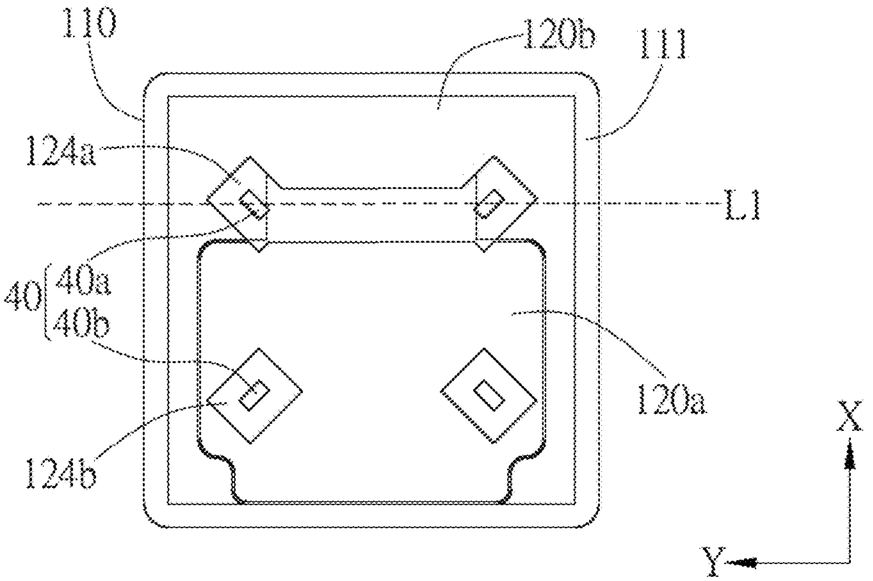
FIGS. 3A and 3B are respectively a plane view and an exploded view of the light guide seat in the first embodiment of the invention.

Referring to FIGS. 1A to 1C, FIGS. 1A and 1B are respectively a perspective view and an exploded view of the finger feature module 1 in a first embodiment of the invention; FIG. 1C is a partial cross-sectional view of the finger feature module 1 of FIG. 1. As shown in FIGS. 1A to 1C, in the first embodiment, the finger feature module 1 can include a light guide seat 10, a circuit board assembly 20, a feature sensor 30, and a plurality of illuminants 40. The light guide seat 10 can include a frame 110 and a plate body 120 disposed in the frame 110. The plate body 120 has a through hole 122, which is eccentrically disposed. The circuit board assembly 20 has a first portion 21 and a second portion 22. The first portion 21 of the circuit board assembly 20 is disposed in the frame 110 and located above the plate body 120. The second portion 22 of the circuit board assembly 20 passes through the through hole 122 to be at least partially located below the plate body 120. The feature sensor 30 is disposed on the first portion 21 of the circuit board assembly 20. The plurality of illuminants 40 are electrically connected to the circuit board assembly 20. Two of the plurality of illuminants 40 (e.g. illuminants 40*a*) are located at two opposite ends of the through hole 122, and the virtual connection line L1 of the two illuminants 40*a* overlaps the through hole 122 (as shown in FIG. 3A).

Specifically, the light guide seat 10 can be made of any suitable optical materials and configured to guide the light emitted from the illuminants 40 along the plate body 120 toward the frame 110, and then emit the light from the top surface (or the light-exit surface 111) of the frame 110 to indicate the sensing area of the finger feature module 1 (i.e., the location of the feature sensor 30). As shown in FIG. 1B, the light guide seat 10 is preferably a three-dimensional light guide member, which extends along the X-axis, Y-axis, Z-axis directions. The light guide seat 10 has an accommodation space 112 and the through hole 122. The accommodation space 112 is configured to accommodate at least the feature sensor 30 and the circuit board assembly 20, and the through hole 122 is configured as a wiring slot for arranging the circuit board assembly 20. For example, the frame 110 of the light guide seat 10 is constituted by a sidewall 114, which laterally surrounds the plate body 120, so that the frame 110 can define the accommodation space 112 therein. In this embodiment, the frame 110 can be a rectangular or square frame formed by four connected sidewalls 114, but not limited thereto. In other embodiments, according to practical applications, the frame 110 can have any suitable geometric shape, such as circle, polygon, and the like. The plate body 120 of the light guide seat 10 is disposed in the frame 110 and extends in the transverse direction to connect the sidewall 114 of the frame 110 to serve as the floor plate of the frame 110. The through hole 122 is provided in the plate body 120, so that the circuit board assembly 20 can partially bent downward to pass through the through hole 122 from above the plate body 120 to below the plate body 120. With such a configuration, the sidewall 114 of the frame 110 can remain intact without damage, thereby enhancing the uniformity of light output from the top surface of the sidewall 114 of the light guide seat 10 (i.e., from the light-exit surface 111). In this embodiment, the through hole 122 is eccentrically disposed with respect to the center of the frame 110 (e.g. indicated by the central axis C). In the embodiment, "the center of the frame" can refer to the central axis C, which extends along the Z-axis direction through the center of the XY plane of the frame 110 (or the accommodation space 112), or the geometric center of the plate body 120. For example, as shown in FIGS. 1B and 1C, the through hole 122 is disposed at a position of the plate body 120 that deviates from the central axis C. As such, the through hole 122 is relatively closer to the sidewall at one side of the X-axis direction (e.g. the right sidewall) and farther away from the sidewall at the other side of the X-axis direction (e.g. the left sidewall), and the through hole 122 preferably extends along the Y-axis direction. In other words, the through hole 122 can be an elongated slot with the major axis and the minor axis respectively arranged along the Y-axis direction and the X-axis direction, and the through hole 122 does not overlap the center of the frame 110 (i.e., the central axis C) in the Z-axis direction.

Figure 7A:
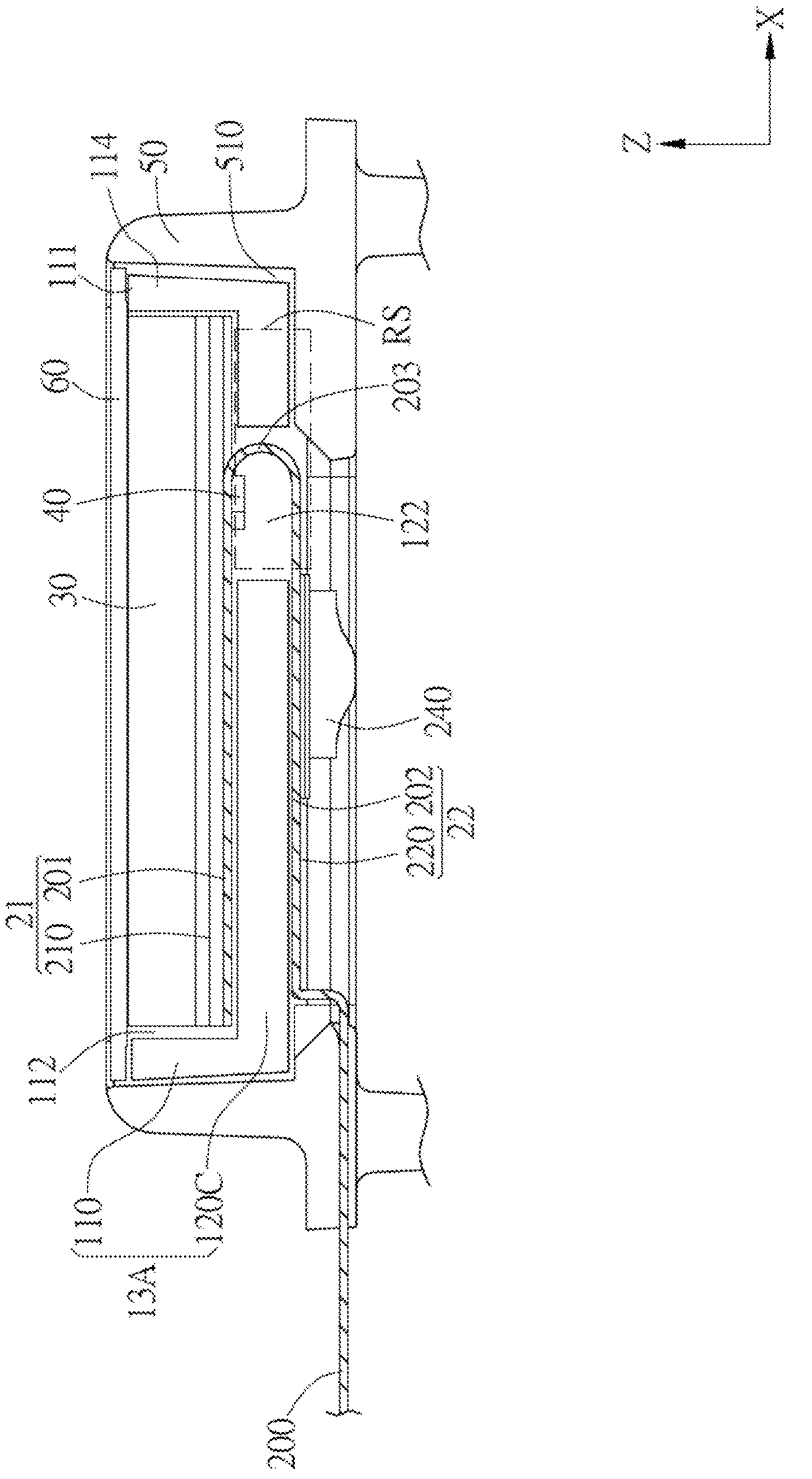
FIG. 7A is a partial cross-sectional view of the finger feature module in a fifth embodiment of the invention.

In this embodiment, the sidewall 114 of the frame 110 preferably extends along the Z-axis direction and laterally surrounds the plate body 120. The plate body 120 can be connected to the inner surface (i.e., the surface facing the central axis C) of the sidewall 114 along the XY plane, so that the light guide seat 10 can have a U-shaped or H-shaped cross section along the Z-axis direction (e.g. vertical direction/stacking direction). For example, as shown in FIG. 1C, in this embodiment, the plate body 120 is connected to the middle section of the frame 110 (or the sidewall 114), so that the light guide seat 10 has the H-shaped cross section along the Z-axis direction. From another aspect, the plate body 120 divides (or partitions) the accommodation space 112 of the light guide seat 10 into an upper room 112U and a lower room 112D. The upper room 112U is a space surrounded by the upper portion 110U of the frame 110 and above the plate body 120, and the lower room 112D is a space surrounded by the lower portion 110D of the frame 110 and below the plate body 120. The through hole 122 of the plate body 120 communicates the upper room 112U with the lower room 112D. In another embodiment (as shown in FIG. 7A), the plate body (e.g. 120C) can be connected to the bottom or lower part of the frame 110 (or the sidewall 114), so that the light guide seat (e.g. 13A) can have the U-shaped cross section along the Z-axis direction. From another aspect, the light guide seat (e.g. 13A) can have a single accommodation space 112 surrounded by the frame 110 and the plate body 120, and the through hole 122 of the plate body 120 communicates the accommodation space 112 of the light guide seat (e.g. 13A) with the outside of the light guide seat. In this embodiment, the plate body 120 is preferably connected to the sidewall surface of the frame 110 substantially orthogonally, i.e., the angle included between the plate body 120 and the sidewall 114 is preferably 90 degrees, but not limited thereto. According to practical applications, the angle between the plate body 120 and the sidewall 114 can be larger than or smaller than 90 degrees, so that the plate body 120 is disposed in the frame 110 in an inclined manner. Moreover, the plate body 120 is preferably a flat plate having a uniform thickness, but not limited thereto. According to practical applications, the plate body 120 can have different thickness at different portions.

In an embodiment, the plate body 120 can be provided with one or more illuminant receiving portions 124, which are configured to accommodate the illuminants 40. The number of the illuminant receiving portions 124 preferably corresponds to the number of the illuminants 40, so that the illuminants 40 can be disposed in the illuminant receiving portions 124 in a one-to-one manner, but not limited thereto. In another embodiment, the number of the illuminant receiving portions 124 can be less than the number of the illuminants 40, so that more than one of the illuminants 40 can be disposed in one illuminant receiving portion 124. The illuminant receiving portion 124 can be a recessed portion (or blind hole) and/or a through hole formed in the plate body 120. For example, in this embodiment, the finger feature module 1 has four illuminants 40, and the plate body 120 is correspondingly provided with four illuminant receiving portions 124. Two of the illuminant receiving portions 124 (e.g. the illuminant receiving portions 124*a*) can be the recessed portions for receiving the illuminants 40*a*, and another two of the illuminant receiving portions 124 (e.g. the illuminant receiving portions 124*b*) can be through holes for receiving the illuminants 40*b*, but not limited thereto.

In an embodiment, the circuit board assembly 20 may include a plurality of functional circuit boards, and the plurality of functional circuit boards can be connected through the flexible printed circuit board 200. In other words, the flexible printed circuit board 200 is configured to carry and electrically connect the plurality of functional circuit boards. For example, the plurality of functional circuit boards can include a feature board and an interface board, and optionally includes a switch board. The feature board is disposed with the feature circuit, which is configured to be electrically connected to the feature sensor 30 and to output the feature signal sensed by the feature sensor 30. The interface board can have the circuitry and the connector and is electrically connected to the feature board and the system end (e.g. connected to the connection interface of the computer mother board) to output the feature signal to the system end, thereby achieving the function of finger feature recognition. The switch board has the switch circuit, and the switch (e.g. 240) is disposed on the switch board. The switch board is electrically connected to the switch and the interface board to output the trigger signal of the switch to the system end through the interface board, so that the finger feature module 1 can function as a keyswitch. In other words, in the case that the functional circuit boards of the circuit board assembly 20 include only the feature board and the interface board, the finger feature module 1 only has the function of finger feature recognition. In the case that the functional circuit boards of the circuit board assembly 20 include the feature board, the interface board, and the switch board, the finger feature module 1 can have both the function of finger feature recognition and the keyswitch function.

Moreover, each functional circuit board can be implemented with the rigid circuit board, the flexible printed circuit board, or the flex-rigid composite circuit board. The flex-rigid composite circuit board includes the flexible printed circuit board and one or more rigid circuit boards, which can be stacked and electrically connected to each other. In addition, each functional circuit board can be implemented with one or more circuit boards, so that the one or more circuit boards may have corresponding circuits to perform the function of the corresponding functional circuit board individually or in combination. In an embodiment, as shown in FIG. 1C, the circuit board assembly 20 may include the flexible printed circuit board 200, a first circuit board 210, and a second circuit board 220. The flexible printed circuit board 200 is configured to carry the first circuit board 210 and the second circuit board 220. The first circuit board 210 is located on the first portion 21 of the circuit board assembly 20 and in the upper room 112U. The second circuit board 220 is located on the second portion 22 of the circuit board assembly 20 and in the lower room 112D. Specifically, all circuit boards of the circuit board assembly 20 can be electrically connected through a single flexible printed circuit board 200. The first circuit board 210 is disposed on a first flexible part 201 of the flexible printed circuit board 200 to form the first portion 21 of the circuit board assembly 20. The second circuit board 220 is disposed on a second flexible part 202 of the flexible printed circuit board 200 to form the second portion 22 of the circuit board assembly 20. In this embodiment, the first circuit board 210 preferably extends to cover the through hole 122, and the second circuit board 220 retreats with respect to the first circuit board 210 to form a retreat space RS. For example, the second circuit board 220 can retreat along the X-axis direction with respect to the first circuit board 210 toward the center of the frame 110 by about 15-55% of the width of the first circuit board 210 to form the retreat space RS, which is configured to accommodate the bending circuit (e.g. bending section 203 described later) of the flexible printed circuit board 200. The flexible printed circuit board 200 has a bending section 203, which is bent downward to pass through the through hole 122. The bending section 203 is connected between the first flexible part 201 and the second flexible part 202 of the flexible printed circuit board 200 and preferably located in the retreat space RS.

In this embodiment, the first circuit board 210 can serve as the feature board, and the second circuit board 220 can serve as the switch board. Correspondingly, as shown in FIG. 1C, the circuit board assembly 20 can further include the switch 240, and the switch 240 is disposed on and electrically connected to the second circuit board 220. The switch 240 can provide the trigger signal in response to the pressing operation of the user, so that the finger feature module 1 can function as the keyswitch. In other words, the finger feature module 1 having the switch 240 can be a finger feature keyswitch (e.g. a power keyswitch with the finger feature recognition function). Specifically, in this embodiment, the feature board can be formed by at least the first circuit board 210, which has the feature circuit and is electrically connected to the feature sensor 30 to output the feature signal. The switch board can be at least formed by the second circuit board 220, which has the switch circuit and is electrically connected to the switch 240 to output the trigger signal. As shown in FIG. 1C, in order to reserve a larger space area of the second flexible part 202 for the switch board (e.g. the second circuit board 220), within the orthographic projection of the feature sensor 30, the bending section 203, the retreat space RS, the through hole 122 of the light guide seat 10 are preferably all located at the eccentric position of the orthographic projection of the feature sensor 30. With such a configuration, the switch 240 disposed on the second circuit board 220 can be substantially located at the central region of the frame 110 to improve the triggering effect of the switch 240. For example, in the vertical direction (i.e., the Z-axis direction), the central axis C of the frame 110 preferably extends through the switch 240. More preferably, the center of the switch 240 substantially overlaps the central axis C of the frame 110 or is in the neighborhood of the central axis C. In other embodiments, the first circuit board 210 and the second circuit board 220 can together function as the feature board, instead of the switch board with the switch 240, i.e., the first circuit board 210 and the second circuit board 220 only have the function of finger feature recognition.

As shown in FIG. 1A, the circuit board assembly 20 may further include a third circuit board 230. The third circuit board 230 can be disposed at the free end of the second portion 22 of the circuit board assembly 20 and extends to outside of the light guide seat 10 to function as the interface board, which is electrically connected to the system end. As such, the first circuit board 210 as the feature board can be electrically connected to the third circuit board 230 as the interface board through the flexible printed circuit board 200 to output the finger feature information to the system end through the interface board. Moreover, the second circuit board 220 as the switch board can be electrically connected to the feature board (e.g. the first circuit board 210) and the interface board (e.g. the third circuit board 230) through the flexible printed circuit board 200 to output the trigger signal to the system end. For example, the flexible printed circuit board 200 may have the outbound circuit, which is electrically connected to the switch board (e.g. the second circuit board 220) and the interface board (e.g. the third circuit board 230) and configured to output the trigger signal to the system end. In this embodiment, the first circuit board 210, the second circuit board 220, and the third circuit board 230 preferably include the rigid circuit board or the rigid board with no circuits.

Figure 2A:
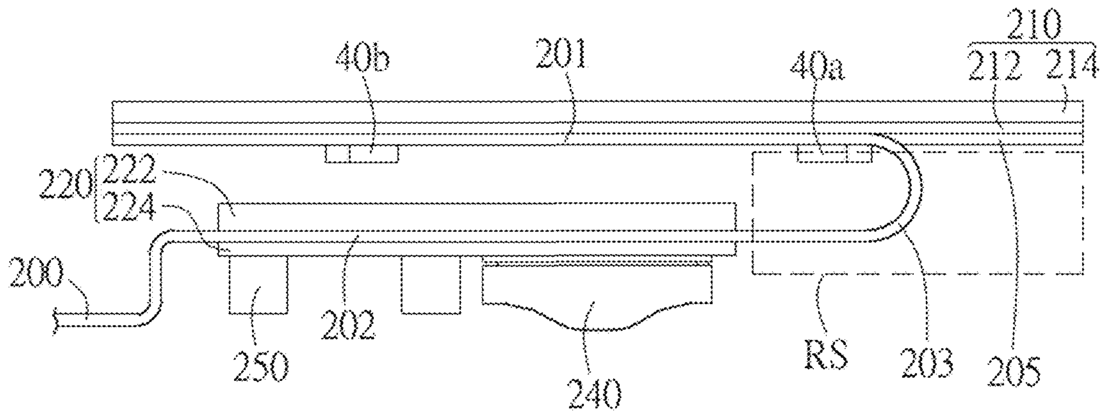
FIGS. 2A and 2B are respectively a partial cross-sectional view and an exploded view of the circuit board assembly in the first embodiment of the invention.
Figure 2B:
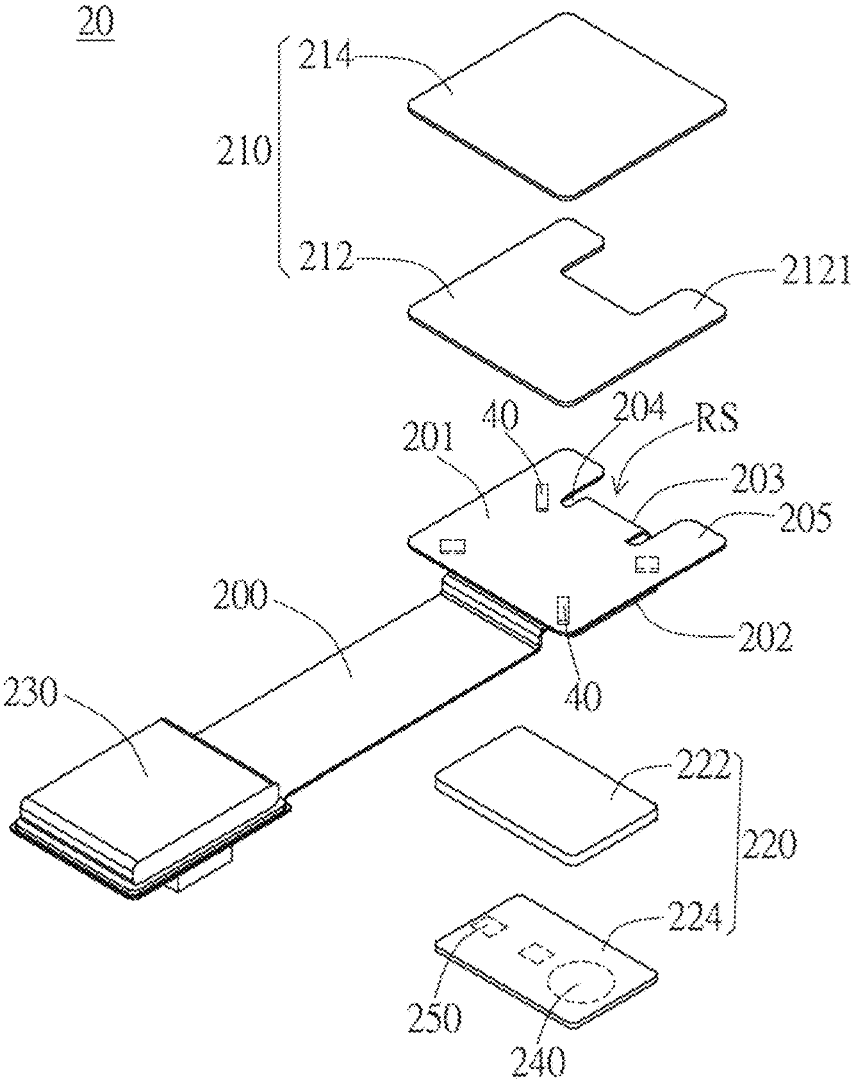
Figure 2C:
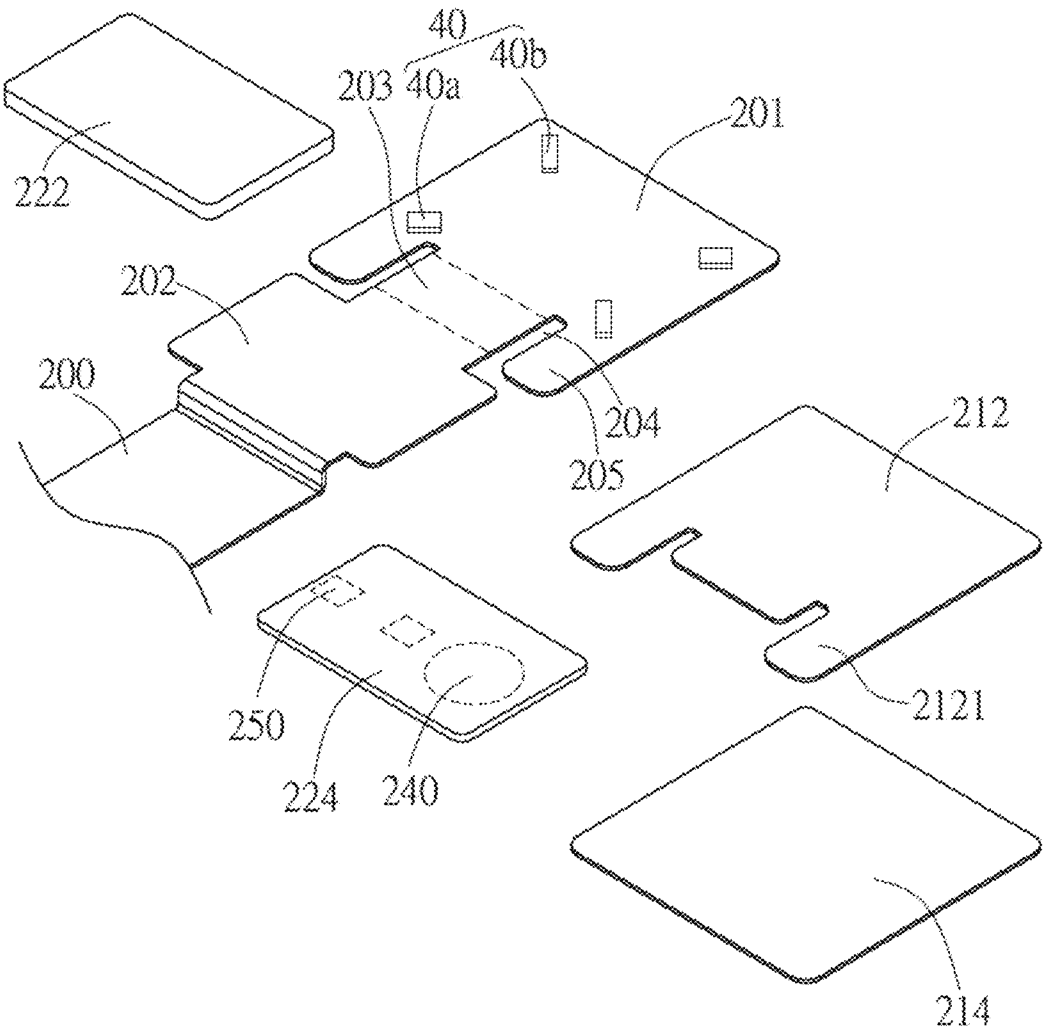
FIG. 2C is an exploded view of a part of the circuit board assembly of FIG. 2B before the flexible printed circuit board is bent.

Referring to FIGS. 2A to 2C, FIGS. 2A and 2B are respectively a partial cross-sectional view and an exploded view of the circuit board assembly 20 in the first embodiment of the invention; FIG. 2C is an exploded view of a part of the circuit board assembly 20 of FIG. 2B before the flexible printed circuit board 200 is bent. As shown in FIGS. 2A to 20, in this embodiment, the flexible printed circuit board 200 can be implemented as a long strip circuit board with opposite first and second ends, wherein the first end is provided for arranging the first circuit board 210 and the second circuit board 220, and the second end is provided for arranging the third circuit board 230. The first end of the flexible printed circuit board 200 is preferably designed with a slit 204, so that the flexible printed circuit board 200 can be bent (or folded-back) with respect to the slit 204 to form the bending section 203, which is connected between the first flexible part 201 and the second flexible part 202. Specifically, as shown in FIG. 2C, before the flexible printed circuit board 200 is bent, the slit 204 is preferably an L-shaped channel, which can be formed at two sides of the bending section 203, so that the first flexible part 201 and the second flexible part 202 are connected only by the bending section 203. Moreover, the first flexible part 201 has a pair of flexible wings 205, which are adjacent to the second flexible part 202 and disposed adjacent and preferably in parallel to the bending section 203 with the slit 204 interposed therebetween. When the first flexible part 201 of the flexible printed circuit board 200 is bent (or folded-back) along the bending section 203 toward the second flexible part 202, the first flexible part 201 and the second flexible part 202 mostly overlaps with each other in the vertical direction (e.g. the Z-axis direction), and the flexible wings 205 extend away from the second flexible part 202 with respect to the bending section 203 to form the folded flexible printed circuit board 200 of FIG. 2B. From another aspect, in the folded flexible printed circuit board 200, the bending section 203 is preferably completely located between the two flexible wings 205 of the first flexible part 201 and does not extend beyond the distal end (i.e., the free end that is away from the second flexible part 202) of the flexible wings 205, to effectively avoid the squeeze and collision between the bending section 203 and the sidewall 114 of the frame 110, reducing the possibility of damage.

Moreover, each of the first circuit board 210 and the second circuit board 220 can be implemented with one or more circuit boards to achieve the desired electrical function. For example, as shown in FIGS. 2A and 2B, in an embodiment, the first circuit board 210 may include circuit boards 212 and 214, and the second circuit board 220 may include circuit boards 222 and 224. The circuit board 212 is disposed on and electrically connected to the first flexible part 201 and preferably has a pair of rigid wings 2121 corresponding to the flexible wings 205. When the circuit board 212 is disposed on the first flexible part 201, the flexible wings 205 is preferably tightly stacked on the rigid wings 2121, and the circuit board 212 preferably covers the bending section 203 of the flexible printed circuit board 200, so that the bending section 203 does not extend beyond the space between the rigid wings 2121, further ensuring the bending section 203 free from damage, but not limited thereto. According to practical applications, the circuit board 212 may not have the rigid wings 2121 and may have a size substantially equal to or smaller than that of the circuit board 214 and a shape corresponding to the circuit board 214. The circuit board 214 is stacked on and electrically connected to the circuit board 212. The feature sensor 30 is stacked on and electrically connected to the circuit board 214. The circuit board 214 may have a rectangular or square shape and preferably has a size corresponding to the feature sensor 30, so that the bending section 203 is preferably located at the inner side of the outermost connection pad 310 (shown in FIG. 1B) of the feature sensor 30, which corresponds to the retreat space RS. From another aspect, in the stacking direction (or the Z-axis direction), the bending section 203 preferably at least partially overlaps the outermost connection pad 310 of the feature sensor 30 in the retreat space RS. In an embodiment, the bending section 203 can be completely located at the inner side of the outermost connection pad 310 of the feature sensor 30, i.e., the bending section 203 does not extend beyond the outermost connection pad 310 in a direction toward the neighboring sidewall 114 of the light guide seat 10. For example, the bending section 203 is spaced apart from the sidewall 114 of the frame 110 by a distance, and the distance is preferably 10% to 45% of the width of the first circuit board 210 (e.g. the circuit board 214), but not limited thereto. In this embodiment, the distance preferably refers to the distance between the protruding point of the bending section 203 and the inner surface of the corresponding sidewall 114 that faces the protruding point in the X-axis direction. The circuit boards 222 and 224 are disposed on and electrically connected to opposite sides (e.g. upper and lower sides) of the second flexible part 202. At least the circuit board 224 has the switch circuit, and the switch 240 is preferably disposed on and electrically connected to the lower side of the circuit board 224. Moreover, one or more electronic devices 250 such as resistor, capacitor, electrostatic discharge (ESD) protection device (e.g. transient voltage suppressor, TSV) can be optionally disposed on the circuit board (e.g. the circuit board 224) to provide the required electrical characteristics.

The feature sensor 30 can be a finger feature recognition chip, which is configured to extract the finger feature of the user for subsequent recognition. For example, the finger feature can be a fingerprint and/or a finger-vein. The feature sensor 30 can be a capacitive, optical, or ultrasonic fingerprint (and/or finger-vein) extraction/recognition chip. The recognition processing unit and the storage unit (not shown) can be integrated at the feature sensor 30 or the system end. In an embodiment, the recognition processing unit and the storage unit are preferably integrated at the system end, such as the central processing unit (CPU) and the memory of the computer mother board, but not limited thereto. In another embodiment, the recognition processing unit and the storage unit can be integrated to the electronic device that is equipped with the finger feature module 1. When cutting the feature sensor 30, it is typically cut into a smaller rectangular (or square) shaped chip. Since the user's pressing or contact usually occurs in the center of the chip, the surrounding corners become inefficient chip areas (e.g. areas of low sensing possibility) or even invalid chip areas (e.g. corners are non-sensing areas). In an embodiment, one or more corner spaces of the feature sensor 30 can be reduced through the cutting design of the feature sensor 30. For example, the cutting design of the feature sensor 30 preferably reserves 85% to 95% of the chip area of the feature sensor 30 to form arch-chamfered or beveled corner(s), but not limited thereto. According to practical applications, the feature sensor 30 can be cut to obtain the maximum retreat space(s) without sacrificing the sensing performance and electrical connection of the feature sensor 30 (i.e., without damaging the connection pad 310), effectively reducing the size of the finger feature module, but not limited thereto. According to practical applications, the feature sensor 30 can have any suitable shape, such as rectangular, square, polygonal geometric shape.

The illuminant 40 can be any suitable light source configured to provide light. For example, the illuminant 400 can be a single-chip or multiple-chip light emitting diode (LED), mini-LED, micro-LED, and the like. The illuminant 40 can be a side-lighting or five-face (e.g. upper/left/right/front/rear faces) lighting illuminant. As shown in FIGS. 2A to 2C, the illuminant 40 is preferably disposed on and electrically connected to the first flexible part 201 of the flexible printed circuit board 200. The illuminant 40 and the first circuit board 210 are respectively located at two opposite sides of the first flexible part 201. From another aspect, the flexible printed circuit board 200 preferably has the light source circuit, which is provided for arranging and electrically connecting the illuminant 40. For example, before the flexible printed circuit board 200 is bent (or folded-back), the illuminant 40 and the first circuit board 210 can be respectively located at the upper side and the lower side of the first flexible part 201 (see FIG. 2C). After the flexible printed circuit board 200 is folded-back, the illuminant 40 and the first circuit board 210 can be respectively located at the lower side and the upper side of the first flexible part 201 (see FIG. 2B). In this embodiment, four illuminants 40 are respectively located in four illuminant receiving portions 124, but not limited thereto. For example, two of the four illuminants 40 (e.g. illuminants 40*a*) can be disposed on the flexible wings 205 of the first flexible part 201 and extend toward the light guide seat 10 to be at least partially received in the two illuminant receiving portions 124*a*. Another two of the four illuminants 40 (e.g. illuminants 40*b*) are disposed at the side of the first flexible part 201 that is farther away from the flexible wings 205 and extend toward the light guide seat 10 to be at least partially received in the two illuminant receiving portions 124*b*, but not limited thereto. In other embodiments, the number of the illuminants 40 can be different, and two or more illuminants 40 can be disposed in the same illuminant receiving portion 124.

FIGS. 2A and 2B show that the circuit boards 212 and 214 of the first circuit board 210 are sequentially stacked on the upper side of the first flexible part 201 to have the configuration that the illuminant 40 and the first circuit board 210 are respectively located at the lower side and the upper side of the first flexible part 201, but not limited thereto. In another embodiment (not shown), at least one of the circuit boards 212 and 214 can be disposed on and electrically connected to the lower side of the first flexible part 201, so that the illuminant 40 is not directly disposed on and electrically connected to the first flexible part 201 of the flexible printed circuit board 200, but disposed on and electrically connected to one of the circuit boards 212 and 214 that is located at the bottommost of the first flexible part 201. In another embodiment, the rigid wings 2121 of the circuit board 212 can be replaced by a rigid board, which has no circuit, to enhance the structural strength of the flexible wings 205, beneficial to the disposition and electrical connection of the illuminant 40*a* on the flexible wings 205.

Referring to FIG. 3A, FIG. 3A is a plane view of the light guide seat 10 in the first embodiment of the invention to show the relative position of the illuminant 40 in the light guide seat 10. As shown in FIG. 3A, the two illuminant receiving portions 124*a* of the plate body 120 are disposed at two opposite ends of the through hole 122, so that the two illuminants 40*a* received in the illuminant receiving portions 124*a* are respectively located at two opposite sides of the bending section 203 of the flexible printed circuit board 200. The virtual connection line L1 (e.g. along the Y-axis direction) of the illuminants 40*a* is substantially perpendicular to the bending direction of the bending section 203 (e.g. the Z-axis or X-axis direction). From another aspect, in the plane view of FIG. 3A, the two illuminants 40*a* and the two illuminant receiving portions 124*a* are located at two sides of the through hole 122 (or the bending section 203), so that the virtual connection line L1 of the illuminants 40*a* and the connecting line of the two illuminant receiving portions 124*a* overlap the through hole 122 (or the bending section 203) along the major axis of the through hole 122. Moreover, since the through hole 122 of the light guide seat 10 is eccentrically disposed, the area neighboring the through hole 122 may not have sufficient light transmission or light output. By arranging the illuminants 40*a* in a manner that the virtual connection line L1 of the illuminants 40*a* overlaps at least one of the bending section 203, the retreat space RS, and the through hole 122 of the light guide seat 10 in the Z-axis direction can promote the uniformity of light output of the light guide seat 10.

Figure 3B:
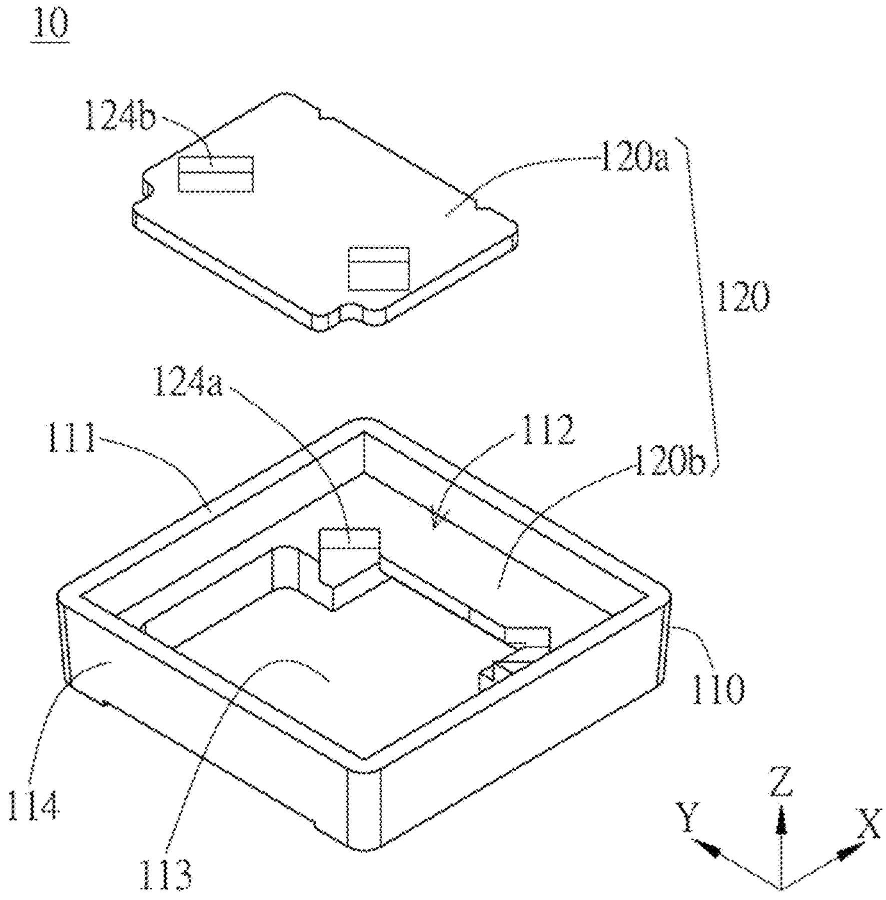

Referring to FIGS. 3A and 3B, FIG. 3B is an exploded view of the light guide seat 10 in the first embodiment of the invention. In this embodiment, the plate body 120 preferably includes an immovable board 120*b* and a removable board 120*a*. The immovable board 120*b* extends from the frame 110 toward the center of the frame 110 to form an opening 113 in the frame 110. The removable board 120*a* preferably partially covers the opening 113 to define the through hole 122 with the immovable board 120*b*. The removable board

120*a* is removably disposed in the frame 110, and the top surface of the removable board 120*a* is preferably co-planar with the top surface of the immovable board 120*b*. The removable board 120*a* partially covers the opening 113, so that a portion of the opening 113 that is not covered by the removable board 120*a* forms (or becomes) the through hole 122. The opening 113 preferably extends beyond the center of the frame 110 (e.g. the central axis C), and the removable board 120*a* partially covers the opening 113 in a manner that the center of the frame 110 is covered, so that the through hole 122 is eccentrically disposed with respect to the center of the frame 110. For example, the immovable board 120*b* and the frame 110 can be an integral structure. The immovable board 120*b* can be a U-shaped plate, which extends or protrudes from the middle section of the sidewall 114 of the frame 110 toward the center of the frame 110 to surround the opening 113. The center of the frame 110 is in the opening 113, i.e., the center of the frame 110 is located within the orthographic projection range of the opening 113. Corresponding to the U-shaped immovable board 120*b*, the removable board 120*a* may have a rectangle-like shape. One end of the removable board 120*a* extends from the mouth of the U-shaped immovable board 120*b* toward the bottom of the U-shaped plate to partially cover the opening 113. As such, the through hole 122 can be formed between the U-shaped immovable board 120*b* and the corresponding end of the removable board 120*a*. In an embodiment, the removable board 120*a* can be positioned in the frame 110 by shape-fitting in the opening 113, but not limited thereto. In another embodiment, the immovable board 120*b* may have a support portion (e.g. 115 shown in FIG. 4A), which is configured to support the removable board 120*a*, so that the removable board 120*a* can be positioned in the frame 110. When the removable board 120*a* is positioned in the frame 110, the first portion 21 of the circuit board assembly 20 is disposed in the frame 110 and located above the removable board 120*a*, and the second portion 22 of the circuit board assembly 20 passes through the through hole 122 to be at least partially located below the removable board 120*a*.

In this embodiment, the immovable board 120*b* has the two illuminant receiving portions 124*a* (or referred as the first illuminant receiving portions). The illuminant receiving portions 124*a* can be the recessed portions and arranged at two opposite ends of the through hole 122 along the major axis of the through hole 122. Each illuminant receiving portion 124*a* is configured to receive at least one of the illuminants 40 (e.g. the illuminant 40*a*). Correspondingly, the removable board 120*a* may have the two illuminant receiving portions 124*b* (or referred as the second illuminant receiving portions). The illuminant receiving portions 124*b* can be through holes that penetrates the removable board 120*a*. The illuminant receiving portions 124*b* and the through hole 122 are disposed at two opposite sides of the frame 110 with respect to the center of the frame 110, and the illuminant receiving portion 124*b* is configured to receive at least one of the illuminants 40 (e.g. the illuminant 40*b*). The illuminant receiving portions 124*a*, 124*b* can be an elongated groove corresponding to the side edge (preferably the long side) of the illuminants 40*a*, 40*b*, so that light emitted from the illuminants 40*a*, 40*b* can effectively enter the immovable board 120*b* and the removable board 120*a* of the plate body 120 from the adjacent sidewalls of the illuminant receiving portions 124*a*, 124*b* to improve the utilization of light.

With the removable design of the plate body 120 of the light guide seat 10, the opening 113 in the frame 110 can be formed with a larger size to effectively facilitate the assembly operations of the circuit board assembly 20. Moreover, by partially covering the opening 113 with the removable board 120*a* to define the eccentrically disposed through hole 122 with the immovable board 120*b* of the frame 110 can be beneficial to the circuit board arrangement of the circuit board assembly 20 to reduce the possibility of component peeling off. In other words, the light guide seat 10 formed by multiple separate parts (e.g. the frame 110 and the removable board 120*a*) can facilitate the manufacturability and the assembly convenience, but not limited thereto. In other embodiments, the removable board 120*a* can form an integral structure with the frame 110, so that the light guide seat 10 is a single component.

As shown in FIGS. 1A to 1C, the finger feature module 1 can further include other components, such as a base holder 50 and a cover 60 to improve the integration application of the finger feature module 1. The base holder 50 serves as the housing of the finger feature module 1 and is configured to support components of the finger feature module 1. The cover 60 is correspondingly disposed on the base holder 50 and configured to provide a plane for the user's finger to place or press. The base holder 50 is configured to support the light guide seat 10 and provided with an opening 520 at bottom, so that the circuit board assembly 20 can further extend to outside of the base holder 50 from the opening 520. Specifically, the base holder 50 has an accommodating portion 510 and the opening 520. The accommodating portion 510 is configured to accommodate the light guide seat 10 as well as the feature sensor 30, the circuit board assembly 20, and the illuminants 40 disposed in the light guide seat 10. For example, the base holder 50 can be a housing with a hollow portion. The hollow portion can be the accommodating portion 510, and the sidewall of the housing around the accommodating portion 510 is configured to surround the sidewall 114 of the frame 110 of the light guide seat 10. The opening 520 is opened at the bottom of the base holder 50 and communicates with the accommodating portion 510 to allow the circuit board assembly 20 to extend from the opening 520 to outside of the base holder 50. In the case that the finger feature module 1 has the switch 240 to implement the keyswitch function, the opening 520 preferably corresponds to the switch 240, so that the switch 240 can be exposed from the opening 520 to correspond to the trigger member of the electronic device (e.g. keyboard). When the user presses the cover 60, the switch 240 can be pressed against the trigger member of the electronic device to generate the trigger signal. The end of the circuit board assembly 20 that includes the third circuit board 230 (i.e., the interface board) can extend downward through the opening 520 to outside of the base holder 50, and then is connected to the system end. In this embodiment, the base holder 50 preferably has a shape corresponding to the shape of the light guide seat 10, such as rectangle or square shape, but not limited thereto. According to practical applications, the base holder 50 can have any suitable shape, such as circular, polygonal, and other geometric shapes. The base holder 50 can further include a positioning portion 530, which is configured to be combined with the electronic device. For example, the positioning portion 530 can be implemented as a rod, which extends outward from the bottom of the housing and is inserted into the hole of the electronic device to achieve the positioning effect, but not limited thereto. The base holder 50 can be positioned on the electronic device by any means as appropriate.

The cover 60 is disposed on the base holder 50 to cover the accommodating portion 510. The cover 60 preferably has a light-permeable portion 610. In the vertical direction (or the light-output direction/Z-axis direction), the top surface (i.e., the light-exit surface 111) of the sidewall 114 of the light guide seat 10 at least partially overlaps the light-permeable portion 610. From another aspect, the orthographic projection of the light-exit surface 111 of the light guide seat 10 on the cover 60 preferably at least partially overlaps the light-permeable portion 610. Specifically, the cover 60 can be a plate made of glass, polymers, for example. The cover 60 is preferably connected to the feature sensor 30 through an adhesive material, so that the cover 60 and the base holder 50 have an integral outer appearance, but not limited thereto. In an embodiment, the entire cover 60 can be the light-permeable portion 610, but not limited thereto. In this embodiment, the light-permeable portion 610 is preferably a ring-shaped band (e.g. square ring) formed on the periphery of the cover 60. When the light guide seat 10 guides the light of the illuminant 40 upward through the plate body 120 and the sidewall 114 of the frame 110 to emit from the top surface (i.e., the light-exit surface 111) of the sidewall 114, light can be substantially emitted from the light-permeable portion 610 to form a ring-shaped light pattern around the feature sensor 30, which not only indicates the location of the sensing areas to the user, but also enhances the optical effect of the appearance.

Figure 4A:
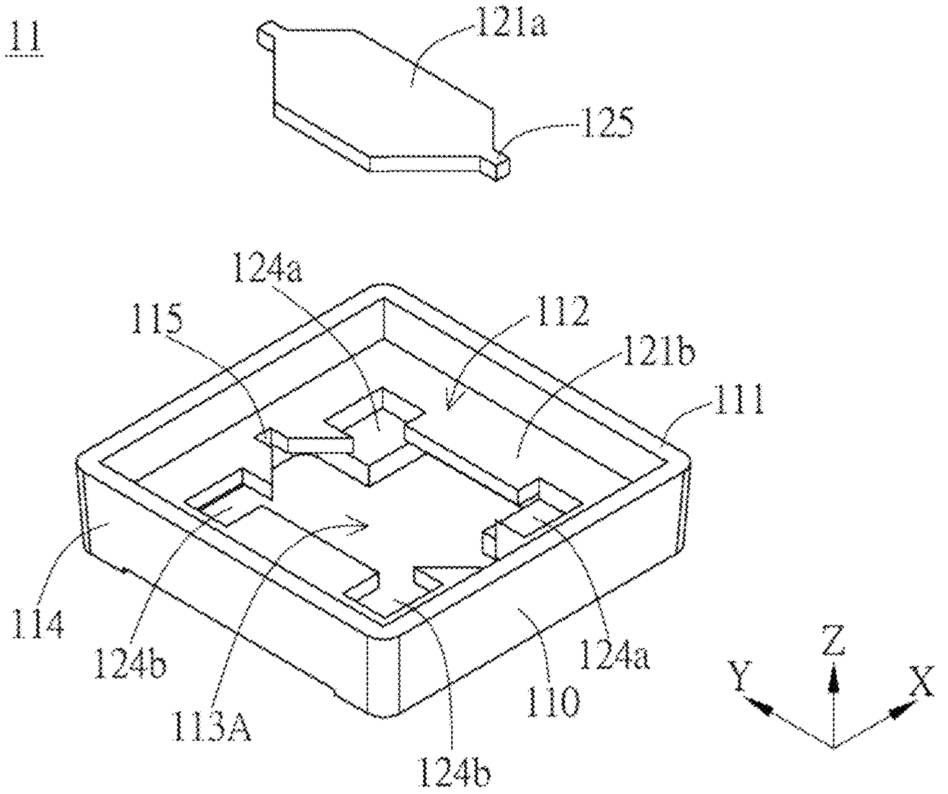
FIGS. 4A and 4B are respectively an exploded view and a plane view of the light guide seat in a second embodiment of the invention.
Figure 4B:
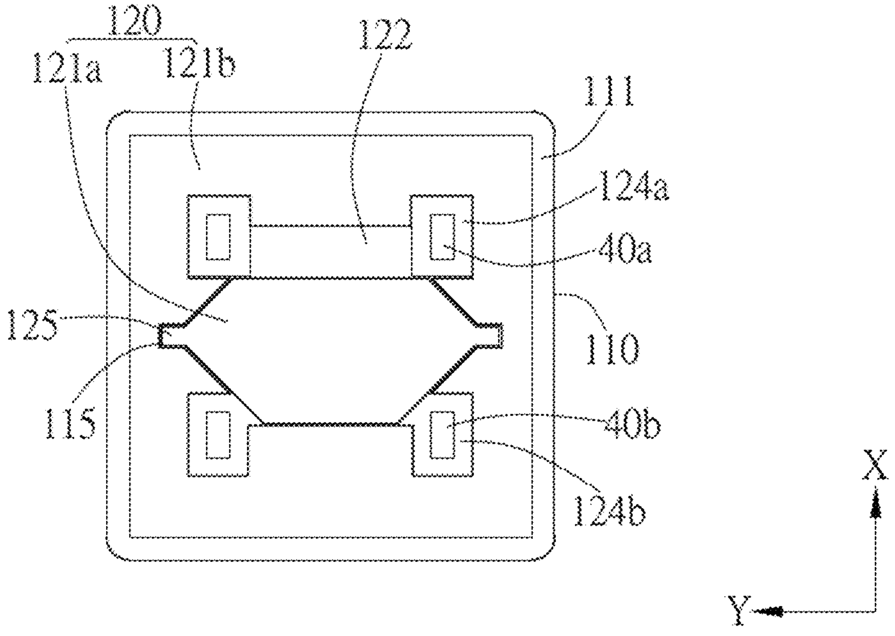

Referring to FIGS. 4A and 4B, FIGS. 4A and 4B are respectively an exploded view and a plane view of the light guide seat 11 in a second embodiment of the invention. Hereinafter, the differences between this embodiment and the previous embodiment are described. For the same or similar details, please refer to the relevant description of the previous embodiment. As shown in FIGS. 4A and 4B, the light guide seat 11 of this embodiment can be used to replace the light guide seat 10 of FIG. 1B, and the difference is the design of the removable board 121*a* and the immovable board 121*b*. Similar to the previous embodiment, when the removable board 121*a* is disposed in the frame 110, the top surface of the removable board 121*a* is preferably co-planar with the top surface of the immovable board 121*b*, but not limited thereto. Specifically, the removable board 121*a* of the light guide seat 11 has an elongated hexagon shape, wherein the minor axis of the removable board 121*a* is arranged along the X-axis direction, and the major axis of the removable board 121*a* is arranged along the Y-axis direction. For example, two parallel sides of the hexagon are preferably parallel to the extending direction (or the major axis) of the through hole 122 (e.g. the Y-axis direction), and a pair of sides between each end of the two parallel sides extend outward and are inclinedly connected to each other. According to practical applications, the two inclinedly connected sides may have the same or different angles or lengths. A pair of tabs 125 are preferably disposed at two sides of the removable board 121*a* where the two inclined sides are connected, and the tabs 125 preferably extend outward along the Y-axis direction from two sides of the removable board 121*a*. In an embodiment, the connecting line of the tabs 125 is preferably parallel to the extending direction (or the major axis) of the through hole 122 (e.g. the Y-axis direction), but not limited thereto.

Corresponding to the shape design of the removable board 121*a*, the immovable board 121*b* preferably extends or protrudes from the surrounding sidewall 114 of the frame 110 toward the center of the frame 110 to form a corresponding opening 113A. The immovable board 121*b* is disposed with a support portion 115, which is configured to support the tab 125 of the removable board 121*a*. For example, the support portion 115 can be a recessed portion that recesses from the board surface of the immovable board 121*b*. Two support portions 115 are preferably disposed along the Y-axis direction at two opposite sides of the frame 110 and adjacent to the opening 113A. Moreover, the support portions 115 are preferably disposed close to the central region of the frame 110, so that the connecting line of the support portions 115 is proximate to or even overlaps the center of the frame 110. When the removable board 121*a* is disposed in the frame 110, the tabs 125 are disposed on the support portions 115, and the removable board 121*a* partially covers the opening 113A to define the through hole 122 with the immovable board 121*b*. Specifically, the removable board 121*a* partially covers the opening 113A to cover the center of the frame 110, so that the through hole 122 is eccentrically disposed with respect to the center of the frame 110. Similar to the embodiment of FIGS. 3A and 3B, the immovable board 121*b* has two illuminant receiving portions 124*a*, which can be the recessed portions and disposed at two opposite ends of the through hole 122 along the major axis thereof. In this embodiment, the portion of the opening 113A that is not covered by the removable board 121*a* can further form one or more illuminant receiving portions 124*b*. Specifically, the opening 113A can include a hexagonal region for arranging the removable board 121*a*, a region for forming the through hole 122, and a region for forming the illuminant receiving portion 124*b*, which communicate with one another. The hexagonal region for arranging the removable board 121*a* is preferably located between the region for forming the through hole 122 and the region for forming the illuminant receiving portion 124*b*. When the removable board 121*a* is disposed in the frame 110, the portion of the opening 113A that is not covered by the removable board 121*a* can become the illuminant receiving portion(s) 124*b* and the through hole 122. The illuminant receiving portions 124*b* and the through hole 122 are located at two opposite sides of the frame 110 with respect to the center of the frame 110. The illuminant receiving portions 124*a*, 124*b* can be an elongated groove corresponding to the side edge (preferably the long side) of the illuminants 40*a*, 40*b*. The major axis and the minor axis of the illuminant receiving portions 124*a*, 124*b* are preferably respectively arranged along the X-axis direction and the Y-axis direction. In this embodiment, the illuminant receiving portions 124*a*, 124*b* are preferably disposed adjacent to four corners of the removable board 121*a*. For example, the illuminant receiving portions 124*a* and 124*b* are respectively disposed at two opposite sides of the tab 125, so that the light emitted from the illuminants 40*a*, 40*b* can avoid the connection interface between the removable board 121*a* and the frame 110 (and the immovable board 121*b*) as much as possible to reduce the transmission loss of light.

Figure 5A:
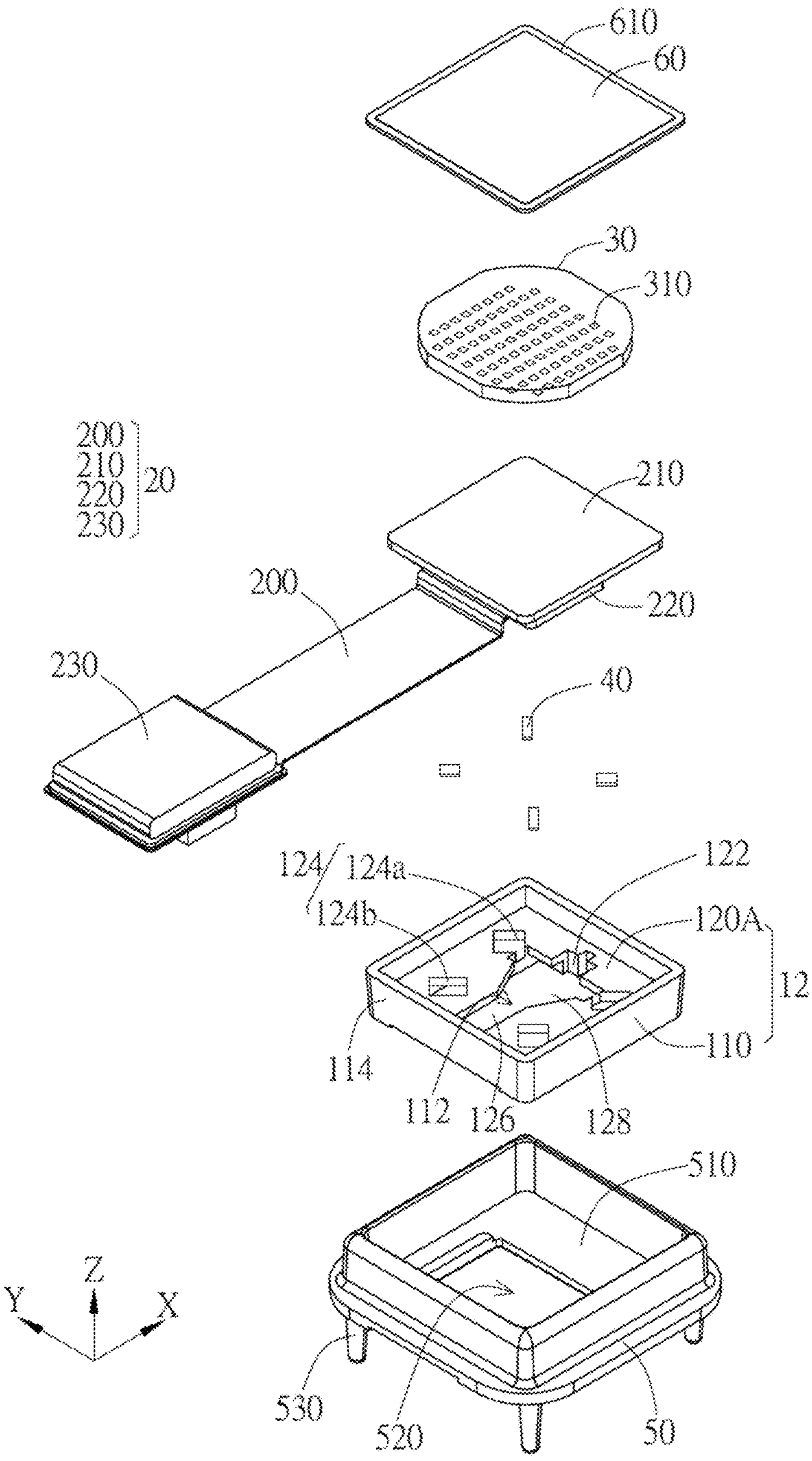
FIGS. 5A and 5B are respectively an exploded view and a cross-sectional view of the finger feature module in a third embodiment of the invention.
Figure 5B:
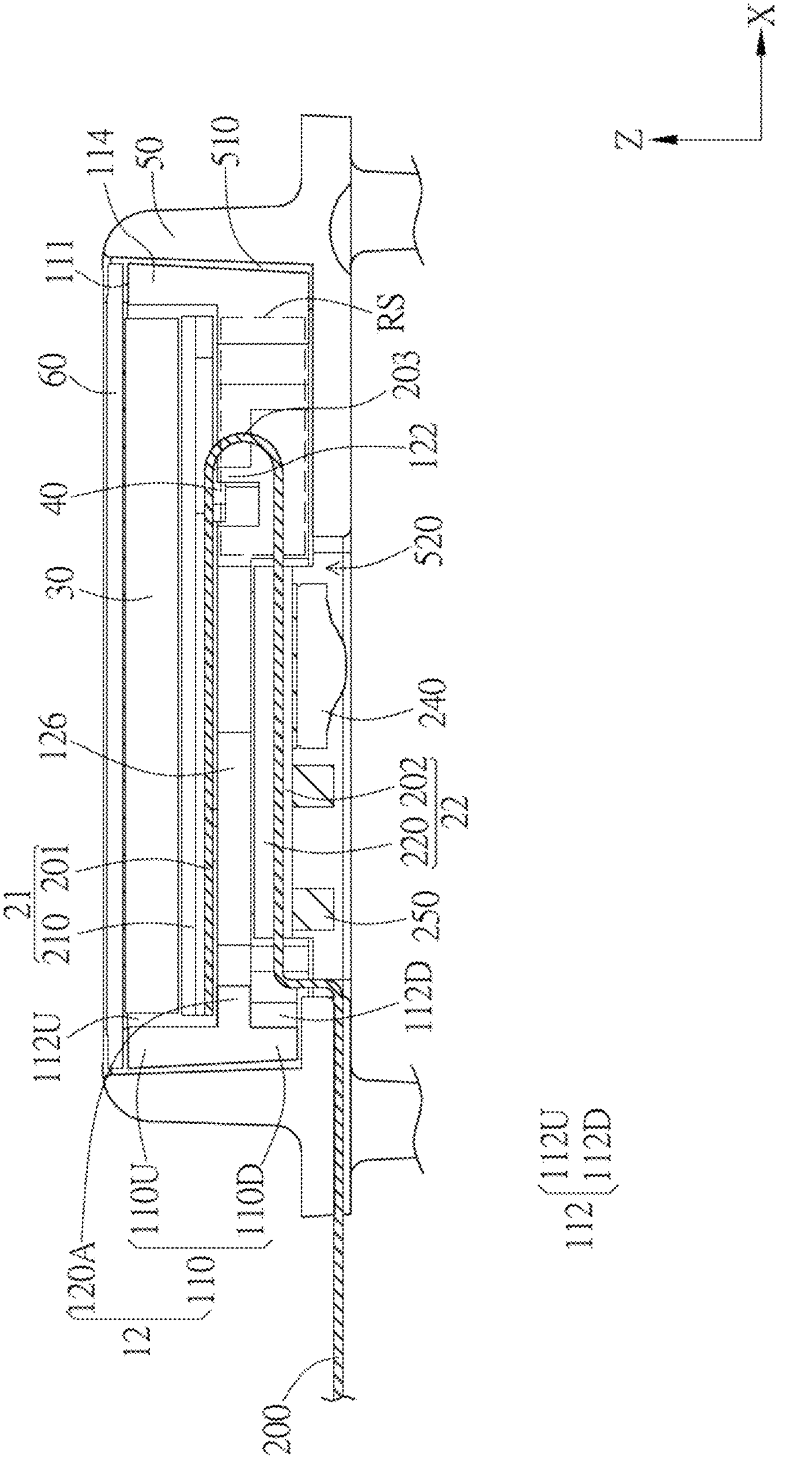
Figure 5C:
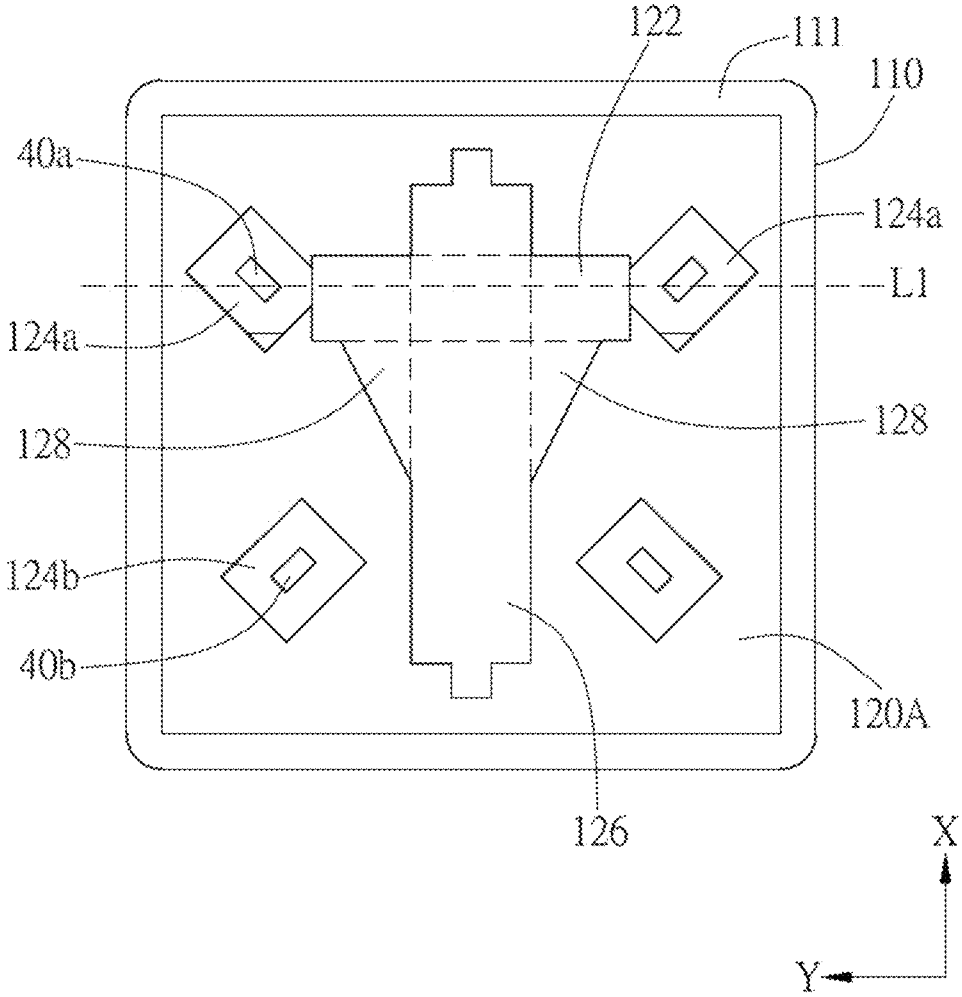
FIG. 5C is a plane view of the light guide seat in the third embodiment of the invention.

Referring to FIGS. 5A to 5C, FIGS. 5A and 5B are respectively an exploded view and a cross-sectional view of the finger feature module in a third embodiment of the invention; FIG. 5C is a plane view of the light guide seat 12 in the third embodiment of the invention. Hereinafter, the differences between this embodiment and the previous embodiments are described. For the same or similar details (e.g. the circuit board assembly 20, the feature sensor 30, the illuminant 40, the base holder 50, and the cover 60), please refer to the relevant description of the previous embodiments. As shown in FIGS. 5A to 5C, the plate body 120A of the light guide seat 12 is preferably connected to the middle section of the frame 110 (or the sidewall 114) to divide the accommodation space 112 of the light guide seat 12 into the upper room 112U and the lower room 112D, as described in the previous embodiments. In this embodiment, the plate body 120A can include the through hole 122 and a central slot 126. The central slot 126 communicates with the through hole 122. The major axis of the central slot 126 is preferably perpendicular to the major axis of the through hole 122. Specifically, corresponding to the arrangement of the major axis of the through hole 122 along the Y-axis direction, the major axis of the central slot 126 is preferably arranged along the X-axis direction and extends across the through hole 122, so that the central slot 126 and the through hole 122 communicate with each other to form a cross-shaped opening. The central slot 126 is provided for the third circuit board 230 (e.g. the interface board) of the circuit board assembly 20 to pass therethrough, and the through hole 122 is provided for the second circuit board 220 (e.g. the switch board) to pass therethrough. In an embodiment, the plate body 120A can further include an expanded slot 128. The expanded slot 128 preferably extends outward from where the central slot 126 and the through hole 122 intersect, so that the cross-shaped opening becomes a funnel-shaped opening, which allows the second circuit board 220 and the flexible printed circuit board 200 to rotate and pass therethrough, further facilitating the assembly operations. The light guide seat 12 can have an integral structure to avoid the transmission loss of light of the plate body 120A caused by the connection interface between multiple parts, and the circuit board assembly 20 can be assembled smoothly without the need for a removable board.

Similar to the previous embodiments, the plate body 120A is disposed with a plurality of illuminant receiving portions 124*a*, 124*b*, and the illuminants 40*a*, 40*b* are respectively received in the illuminant receiving portions 124*a*, 124*b*. As shown in the figures, two illuminant receiving portions 124*a* are respectively disposed at two ends of the major axis of the through hole 122. The connecting line of the illuminant receiving portions 124*a* or the virtual connection line L1 of the illuminants 40*a* preferably overlaps the through hole 122 (or the bending section 203). The illuminant receiving portions 124*a* and 124*b* are disposed along the major axis of the central slot 126 at two ends of the central slot 126, and the two illuminant receiving portions 124*b* are located at two opposite sides of the central slot 126 with respect to the major axis of the central slot 126. In this embodiment, the illuminant receiving portions 124*a*, 124*b* can be an elongated groove corresponding to the side edge (preferably the long side) of the illuminants 40*a*, 40*b*, and the major axes of the illuminant receiving portions 124*a*, 124*b* are preferably directed toward the center of the frame 110 to form a radiation configuration, but not limited thereto.

Figure 6A:
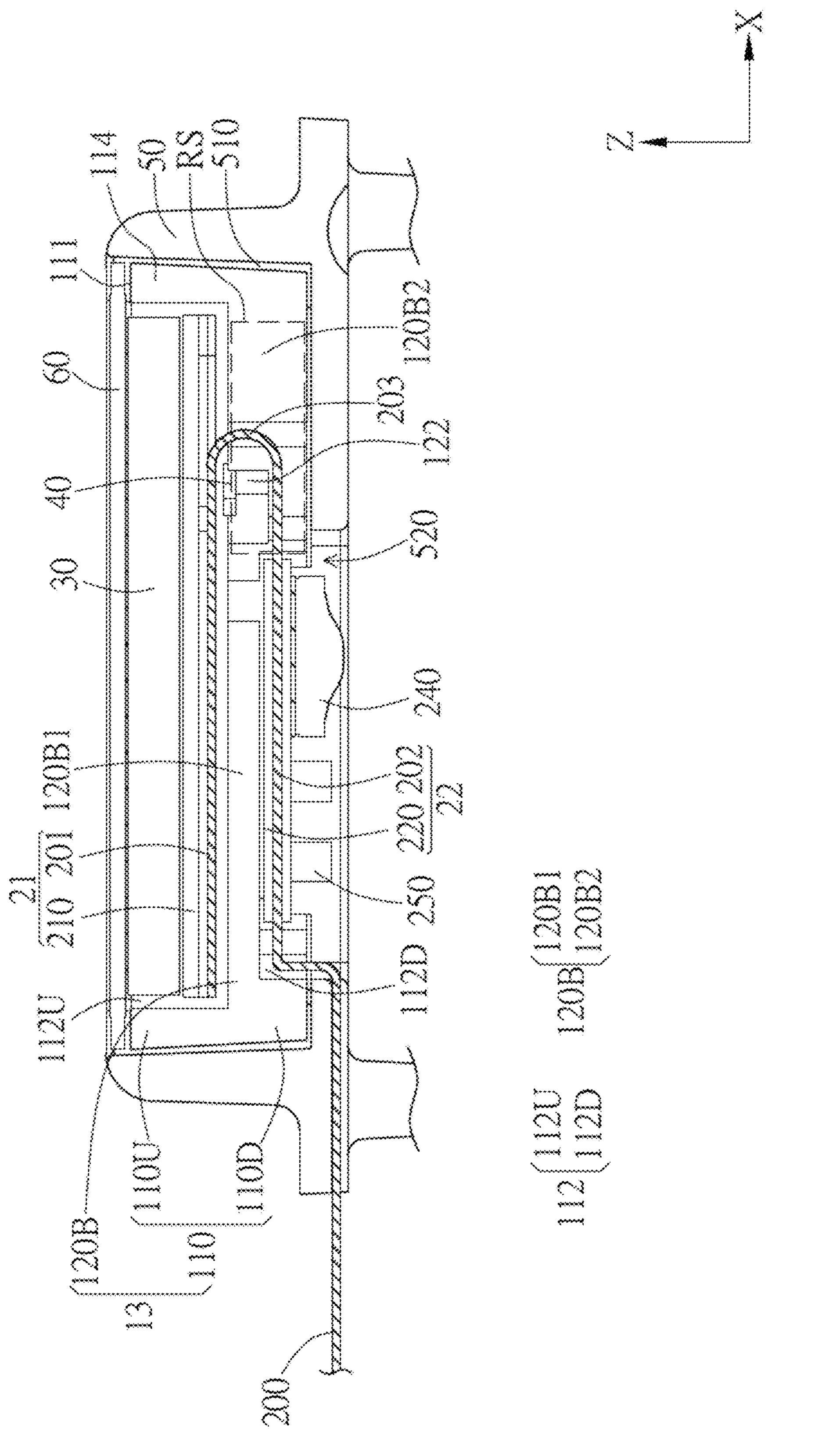
FIG. 6A is a partial cross-sectional view of the finger feature module in a fourth embodiment of the invention.
Figure 6B:
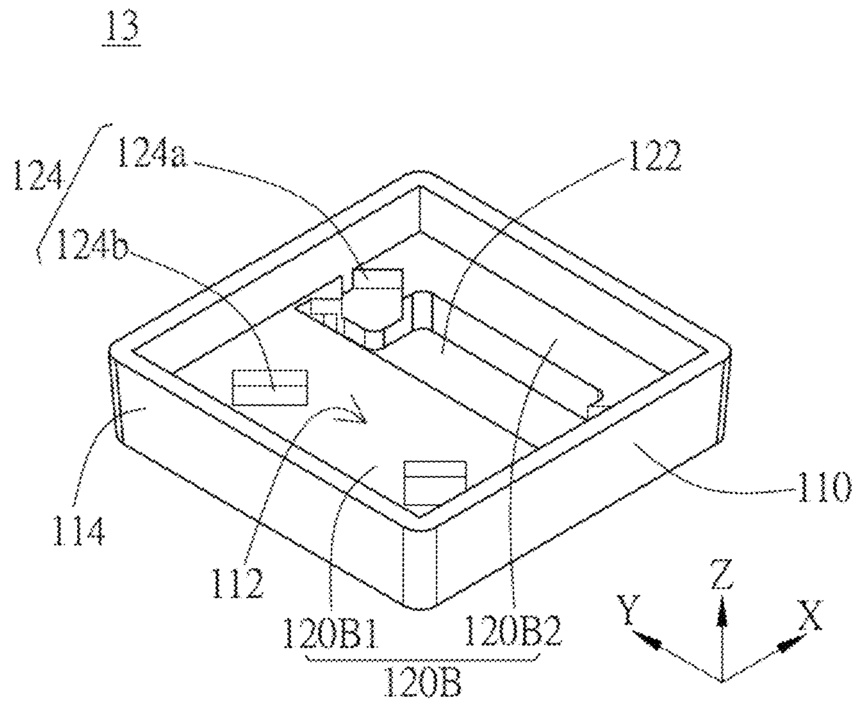
FIGS. 6B and 6C are respectively a perspective view and a plane view of the light guide seat in the fourth embodiment of the invention.
Figure 6C:
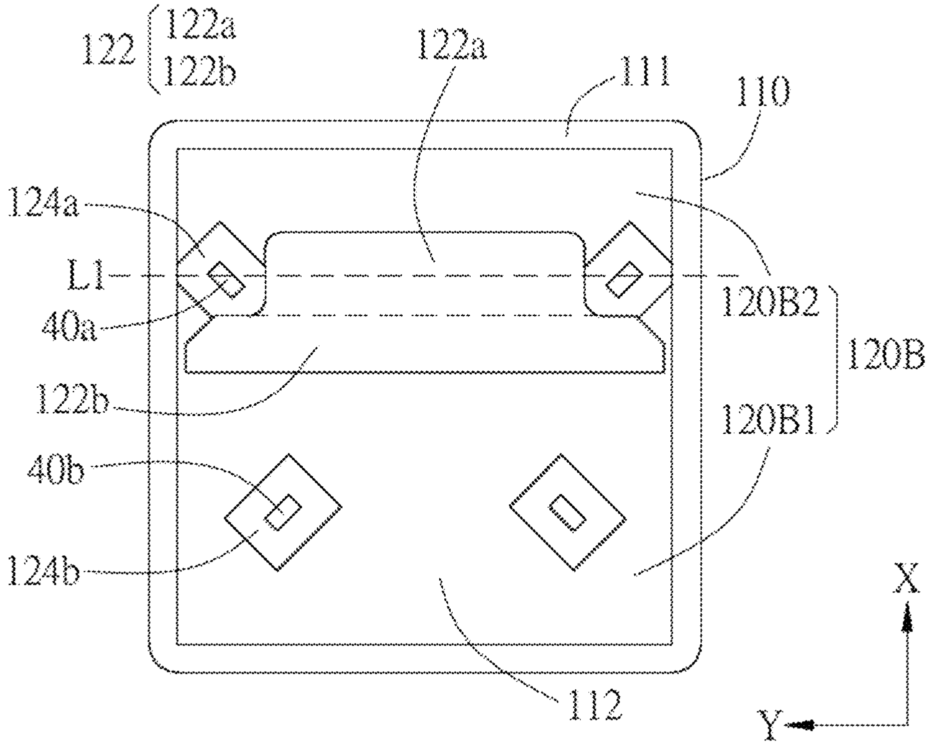

Referring to FIGS. 6A to 6C, FIG. 6A is a partial cross-sectional view of the finger feature module in a fourth embodiment of the invention; FIGS. 6B and 6C are respectively a perspective view and a plane view of the light guide seat 13 in the fourth embodiment of the invention. Hereinafter, the differences between this embodiment and the previous embodiment are described. For the same or similar details, please refer to the relevant description of the previous embodiment. As shown in FIGS. 6A to 6C, the light guide seat 13 of this embodiment can be used to replace the light guide seat of the previous embodiments, such as the light guide seat 12 of FIG. 5A. In this embodiment, the plate body 120B includes a first plate part 120B1 and a second plate part 120B2. The first plate part 120B1 and the second plate part 120B2 may have different thicknesses. For example, the thickness of the first plate part 120B1 can be smaller than that of the second plate part 120B2. The first plate part 120B1 preferably extends from the middle section of the sidewall 114 of the frame 110 toward the center of the frame 110 to divide the accommodation space 112 of the light guide seat 13 into the upper room 112U and the lower room 112D as described in the previous embodiments. The second plate part 120B2 preferably extends from the sidewall 114 of the frame 110, which is opposite to the first plate part 120B1, toward the first plate part 120B1, so that the through hole 122 is formed between the first plate part 120B1 and the second plate part 120B2. In this embodiment, the first plate part 120B1 preferably extends to at least the center of the frame 110 or beyond the center of the frame 110, so that the through hole 122 is eccentrically disposed. In other words, the extending length of the first plate part 120B1 (e.g. the length in the X-axis direction) is preferably larger than or equal to ½ or more of the width of the accommodation space 112 of the frame 110 in the same direction. The thickness of the second plate part 120B2 is preferably less than or equal to the height (i.e., the distance from the bottom to the top of the sidewall 114) of the sidewall 114 of the frame 110. In this embodiment, the maximum thickness of the second plate part 120B2 is preferably designed to be equal to or less than the height of the first plate part 120B1 on the sidewall 114 (i.e., the distance from the bottom of the sidewall 114 to where the first plate part 120B1 is disposed), so that the top surface of the second plate part 120B2 and the top surface of the first plate part 120B1 can be co-planar, but not limited thereto. According to practical applications, the design of the thickness and location of the second plate part 120B2 is not limited to be co-planar with the first plate part 120B1. As shown in FIG. 6A, in this embodiment, the thickness of the second plate part 120B2 is substantially equal to the sum of the height of the lower room 112D in the Z-axis direction and the thickness of the first plate part 120B1, so that the upper room 112U has a wider width than the lower room 112D in the X-direction. From another aspect, the second plate part 120B2 can be considered as the bottom plate of the frame 110, so that "the plate body having an eccentrically disposed through hole (or the plate body having a through hole which is eccentrically disposed)" can refer to that the plate body itself has the through hole at the eccentric position, or the plate body and the sidewall (or bottom plate) of the frame together define an opening as the through hole between the plate body and the sidewall (or bottom plate) of the frame at the eccentric position.

Mover, in this embodiment, the through hole 122 preferably has a hat-like shape and includes a crown region 122*a* and a brim region 122*b*. For example, in the Y-axis direction, the width of the crown region 122*a* is smaller than that of the brim region 122*b*. Two illuminant receiving portions 124*a* are disposed on the second plate part 120B2 and preferably located at two opposite sides of the crown region 122*a*, so that the virtual connection line L1 of the illuminants 40*a* can overlap the crown region 122*a* of the through hole 122 (or the bending section 203). The brim region 122*b* extends from the crown region 122*a* toward the center of the frame 110 and is located between the crown region 122*a* and the first plate part 120B1 to facilitate the assembly operation of the circuit board assembly 20. Similar to the previous embodiments, two illuminant receiving portions 124*b* are provided on the first plate part 120B1 for arranging the illuminants 40*b*. The plate body 120B and the frame 110 of the light guide seat 13 are an integral structure to avoid the transmission loss of light of the plate body 120B caused by the connection interface between multiple parts, and to provide sufficient space for the assembly operation and/or for the switch 240.

Figure 7B:
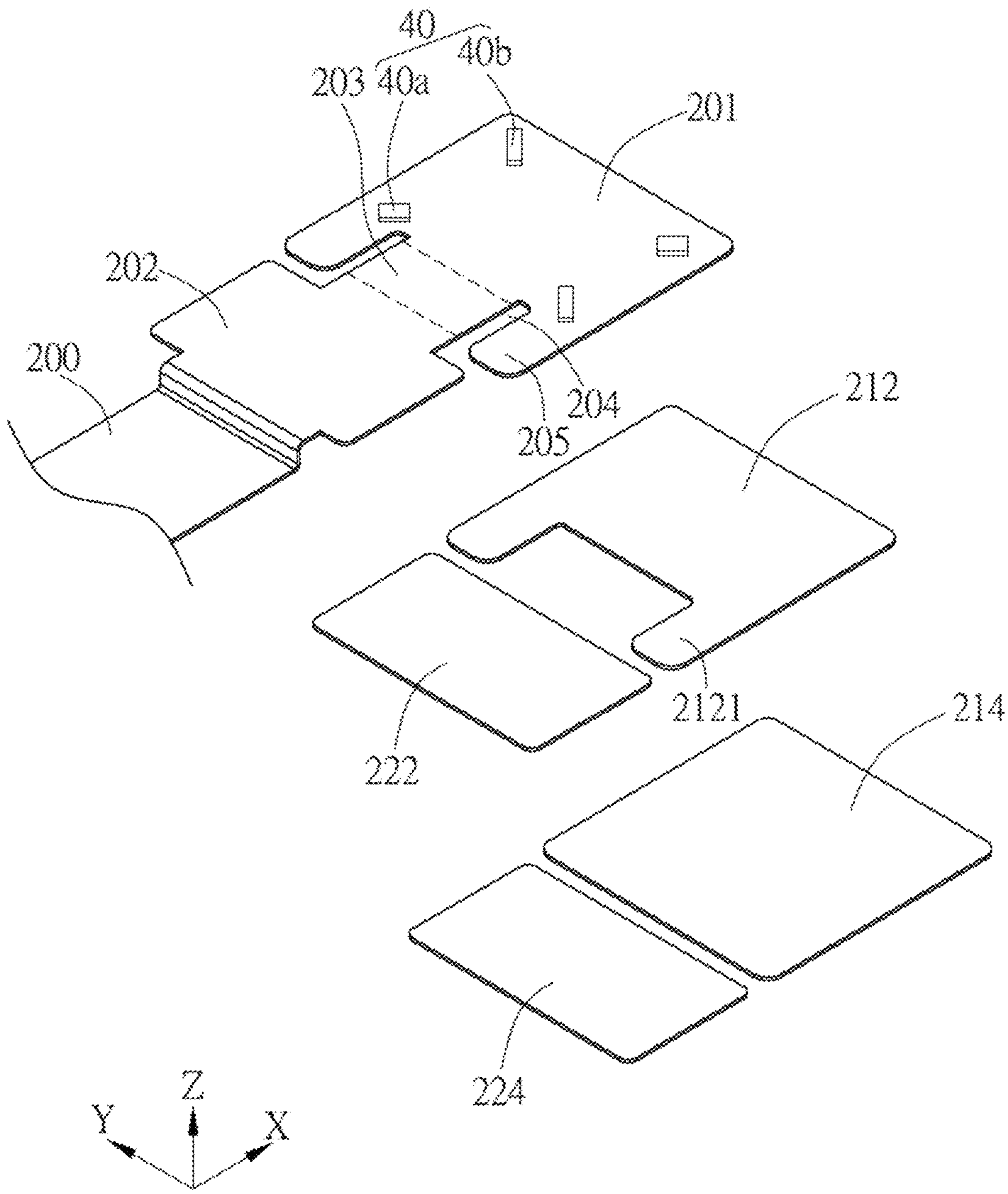
FIG. 7B is an exploded view of a part of the circuit board assembly of FIG. 7A before the flexible printed circuit board is bent.
Figure 7C:
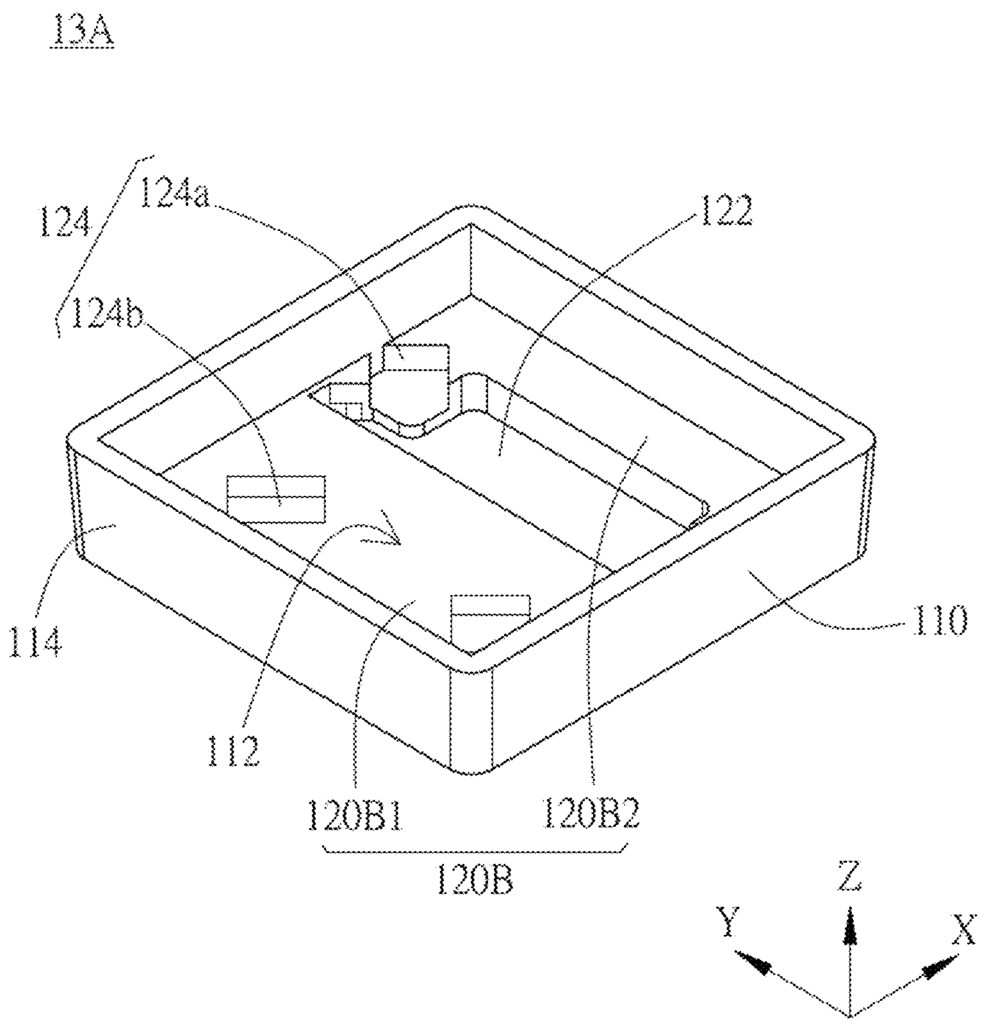
FIG. 7C is a perspective view of the light guide seat in the fifth embodiment of the invention.

Referring to FIGS. 7A to 7C, FIG. 7A is a partial cross-sectional view of the finger feature module in a fifth embodiment of the invention; FIG. 7B is an exploded view of a part of the circuit board assembly of FIG. 7A before the flexible printed circuit board 200 is bent; FIG. 7C is a perspective view of the light guide seat 13A in the fifth embodiment of the invention. Hereinafter, the differences between this embodiment and the previous embodiment are described. For the same or similar details, please refer to the relevant description of the previous embodiments. As shown in FIGS. 7A to 7C, in this embodiment, the light guide seat 13A has a structure similar to the light guide seat 13 of FIG. 6. The difference is that the plate body 120B is disposed at the bottom of the frame 110, so that the light guide seat 13A has a single accommodation space 112. Specifically, the first plate part 120B1 and the second plate part 120B2 of the plate body 120B preferably have the same thickness and are respectively connected to the bottoms of opposite sidewalls 114 of the frame 110. The first plate part 120B1 and the second plate part 120B2 extend toward each other to form the through hole 122 as described above. Moreover, as shown in FIG. 7B, in this embodiment, the circuit board assembly may have a different circuit board arrangement. The configuration of the flexible printed circuit board 200 of the circuit board assembly is similar to the previous embodiments. The difference is the arrangement of the circuit boards 212, 214, 222, 224. For example, the circuit board 212 and the circuit board 222 can be implemented as two pieces of circuit boards, which are cut from the same circuit board. The circuit board 214 and the circuit board 224 can also be implemented as two pieces of circuit boards, which are cut from the same circuit board. The circuit board 212 and the circuit board 222 are respectively disposed on and electrically connected to the same side (e.g. the lower side before bending) of the first flexible part 201 and the second flexible part 202 of the flexible printed circuit board 200. The circuit board 214 and the circuit board 224 are respectively stacked on and electrically connected to the circuit board 212 and the circuit board 222. Before the flexible printed circuit board 200 is bent or after the folded flexible printed circuit board 200 of FIG. 7A is pulled straight, the circuit board 212 and the circuit board 222 are located at the same layer or the same height position, and the circuit board 214 and the circuit board 224 are also located at the same layer or the same height position. Moreover, since the plate body 120B is disposed on the bottom of the frame 110, the second circuit board 220 which is disposed on the second portion 22 of the circuit board assembly is located under the bottom of the light guide seat 13A, and the switch 240 is located below the light guide seat 13A and at least partially in the opening 520 of the base holder 50 to be exposed from the opening 520.

Figure 8A:
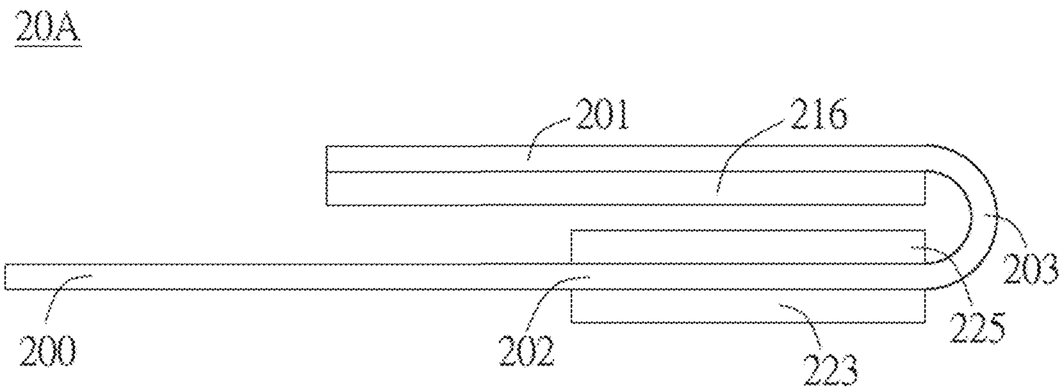
FIGS. 8A to 8C are partial cross-sectional views of the circuit board assembly in various embodiments of the invention.
Figure 8B:
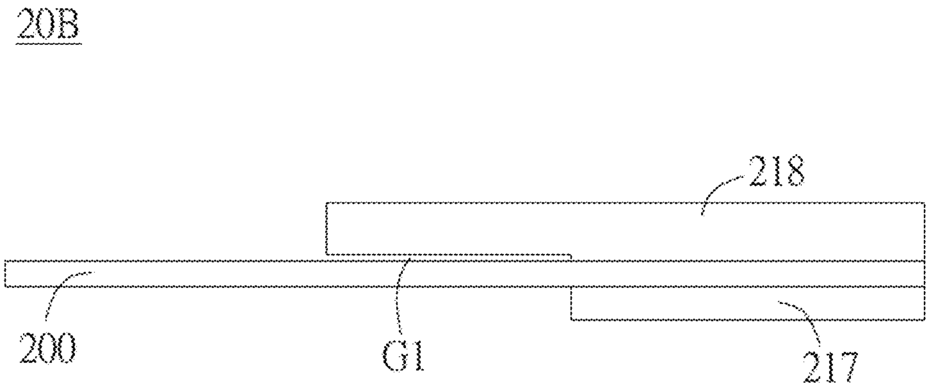
Figure 8C:
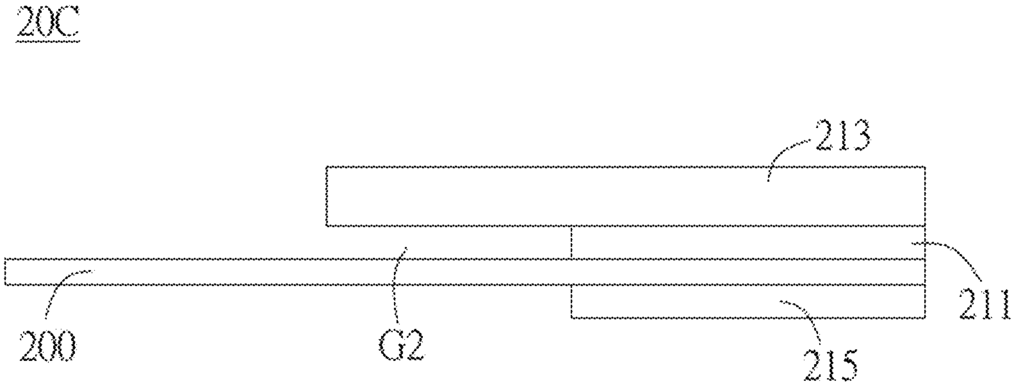

Referring to FIGS. 8A to 8C, FIGS. 8A to 8C are partial cross-sectional views of the circuit board assembly in various embodiments of the invention, wherein any of the circuit board assemblies of FIGS. 8A to 8C (e.g. 20A, 20B, or 20C) can be used to replace the circuit board assembly (e.g. 20) of the previous embodiments and applied to the finger feature module of any of the previous embodiments. As shown in FIG. 8A, in this embodiment, the circuit board assembly 20A includes a rigid board 216 and the flexible printed circuit board 200. The rigid board 216 is located on the first portion (e.g. the first portion 21 in the previous embodiment) of the circuit board assembly 20A. The flexible printed circuit board 200 is configured to carry the rigid board 216. The feature sensor 30 can be disposed on and electrically connected to the flexible printed circuit board 200 and at least partially overlaps the rigid board 216 with the flexible printed circuit board 200 therebetween. Specifically, the first portion of the circuit board assembly 20A is the portion disposed above the plate body, and the rigid board 216 can be used to replace the first circuit board 210 of the previous embodiments. The rigid board 216 has no circuitry and is configured to function as a reinforcement board for supporting the feature sensor 30. For example, the rigid board 216 is preferably disposed on the lower surface of the first flexible part 201 of the flexible printed circuit board 200. Corresponding to the rigid board 216, the feature sensor 30 can be directly disposed on and electrically connected to the upper surface of the first flexible part 201 of the flexible printed circuit board 200, so that the feature sensor 30 can be supported by the underlying rigid board 216. Moreover, the circuit board assembly 20A may further include circuit boards 223 and 225. The circuit boards 223 and 225 are respectively disposed on the lower surface and the upper surface of the second flexible part 202 of the flexible printed circuit board 200 and retreat with respect to the rigid board 216. The flexible printed circuit board 200 has the bending section 203 connecting the first flexible part 201 and the second flexible part 202. The feature circuit can be at least disposed on the flexible printed circuit board 200, or the flexible printed circuit board 200 and at least one of the circuit boards 223 and 225.

As shown in FIG. 8B, the circuit board assembly 20B includes the flexible printed circuit board 200, a first circuit board 218, and a second circuit board 217. The first circuit board 218 and the second circuit board 217 are respectively disposed on the upper side and the lower side of the flexible printed circuit board 200. One end portion of the first circuit board 218 has a gap G1 with the flexible printed circuit board 200, and the second circuit board 217 retreats with respect to the end portion of the first circuit board 218. Specifically, the end portion of the first circuit board 218 may not be adhered to the flexible printed circuit board 200, so that the end portion of the first circuit board 218 becomes a free end. The second circuit board 217 retreats with respect to the free end of the first circuit board 218 (or the gap G1), so that the second circuit board 217 and the gap G1 at least partially do not overlap with each other, thereby allowing the flexible printed circuit board 200 to be bent relative to the first circuit board 218. As such, the flexible printed circuit board 200 can easily pass through the through hole 122 of the previous embodiments.

As shown in FIG. 8C, the circuit board assembly 20C includes the flexible printed circuit board 200, a first circuit board 213, and a second circuit board 215. The first circuit board 213 and the second circuit board 215 are respectively disposed on the upper side and the lower side of the flexible printed circuit board 200. One end portion of the first circuit board 213 has a gap G2 with the flexible printed circuit board 200, and the second circuit board 215 retreats with respect to the first circuit board 213. In this embodiment, the circuit board assembly 20C further includes an interposed circuit board 211. The interposed circuit board 211 is located between the first circuit board 213 and the flexible printed circuit board 200, and the interposed circuit board 211 retreats with respect to the end portion of the first circuit board 213 to form the gap G2. Specifically, in the extending direction (or the major axis direction) of the flexible printed circuit board 200, the length of the first circuit board 218 is larger than that of the interposed circuit board 211, so that when the first circuit board 218 is stacked on the interposed circuit board 211, the first circuit board 218 has a non-overlapping portion, which forms the gap G2 with the flexible printed circuit board 200 due to the thickness of the circuit board 211. The second circuit board 215 retreats with respect to the non-overlapping portion of the first circuit board 218 (or the gap G2), so that the second circuit board 215 and the gap G2 at least partially do not overlap with each other, thereby allowing the flexible printed circuit board 200 to be bent relative to the first circuit board 213. As such, the flexible printed circuit board 200 can easily pass through the through hole 122 described in the previous embodiments.

It is noted that the switch 240 is not shown in FIGS. 8A to 8C, but according to practical applications, the circuit board assembly 20A, 20B, or 20C may or may not include the switch 240 to function or not function as the keyswitch.

Although the preferred embodiments of the invention have been described herein, the above description is merely illustrative. The preferred embodiments disclosed will not limit the scope of the invention. Further modification of the invention herein disclosed will occur to those skilled in the respective arts and all such modifications are deemed to be within the scope of the invention as defined by the appended claims.

What is claimed is:

1. A finger feature module, comprising:

a light guide seat comprising a frame and a plate body, the plate body disposed in the frame and having a through hole eccentrically disposed, wherein the plate body is connected to a middle section of the frame to define an upper room and a lower room in the frame; the upper room and the lower room are respectively above and below the plate body; the through hole communicates the upper room with the lower room;

a circuit board assembly having a first portion and a second portion, the first portion of the circuit board assembly disposed in the frame and located above the plate body, the second portion of the circuit board assembly passing through the through hole to be at least partially located below the plate body;

a feature sensor disposed on the first portion of the circuit board assembly; and a plurality of illuminants electrically connected to the circuit board assembly, wherein two of the plurality of illuminants are located at two opposite ends of the through hole, and a virtual connection line of the two of the plurality of illuminants overlaps the through hole.

2. The finger feature module of claim 1, wherein the circuit board assembly comprises a first circuit board located in the upper room and a second circuit board located in the lower room.

3. The finger feature module of claim 1, wherein the plate body is disposed with a plurality of illuminant receiving portions; the plurality of illuminants are respectively received in the plurality of illuminant receiving portions.

4. The finger feature module of claim 1, wherein the plate body comprises an immovable board and a removable board; the immovable board extends from the frame toward a center of the frame to form an opening in the frame; the removable board partially covers the opening to define the through hole with the immovable board.

5. The finger feature module of claim 1, wherein the plate body further has a central slot; the central slot communicates with the through hole; a major axis of the central slot is perpendicular to a major axis of the through hole.

6. The finger feature module of claim 5, wherein the plate body further has an expanded slot; the expanded slot extends outward from where the central slot and the through hole intersect.

7. The finger feature module of claim 1, wherein the circuit board assembly comprises a first circuit board and a second circuit board; the first circuit board is located on the first portion of the circuit board assembly and covers the through hole; the second circuit board is located on the second portion of the circuit board assembly and retreats with respect to the first circuit board to form a retreat space.

8. The finger feature module of claim 7, wherein the circuit board assembly comprises a flexible printed circuit board configured to carry the first circuit board and the second circuit board; the flexible printed circuit board has a bending section passing through the through hole; the bending section is located in the retreat space.

9. The finger feature module of claim 8, wherein the bending section is spaced apart from a sidewall of the frame by a distance; the distance is 10% to 45% of a width of the first circuit board.

10. The finger feature module of claim 1, further comprising a base holder, wherein the base holder is configured to support the light guide seat; the base holder is provided with an opening at bottom; the circuit board assembly extends to outside of the base holder from the opening.

11. The finger feature module of claim 10, wherein the circuit board assembly further comprises a switch; the switch is exposed from the opening, so that the finger feature module has a keyswitch function.

12. A finger feature module, comprising:

a light guide seat comprising a frame and a removable board, the removable board removably disposed in the frame to define a through hole;

a circuit board assembly having a first portion and a second portion, the first portion of the circuit board assembly disposed in the frame and located above the removable board, the second portion of the circuit board assembly passing through the through hole to be at least partially located below the removable board;

a feature sensor disposed on the first portion of the circuit board assembly; and one or more illuminants electrically connected to the circuit board assembly to emit light toward the light guide seat.

13. The finger feature module of claim 12, wherein the frame has an immovable board; the immovable board extends from the frame toward a center of the frame to form an opening in the frame; the removable board partially covers the opening, so that a portion of the opening not covered by the removable board forms the through hole.

14. The finger feature module of claim 13, wherein the center of the frame is in the opening; the removable board partially covers the opening to cover the center of the frame, so that the through hole is eccentrically disposed with respect to the center of the frame.

15. The finger feature module of claim 13, wherein the portion of the opening not covered by the removable board further forms one or more illuminant receiving portions.

16. A finger feature module, comprising:

a light guide seat comprising a frame and a plate body, the frame defining an accommodation space, the plate body disposed in the frame to divide the accommodation space into an upper room and a lower room, the plate body having a through hole communicating the upper room with the lower room;

a circuit board assembly comprising a flexible printed circuit board, a first circuit board, and a second circuit board, the first circuit board and the second circuit board disposed on the flexible printed circuit board, the flexible printed circuit board extending through the through hole from the upper room to the lower room, the first circuit board located in the upper room, the second circuit board located in the lower room;

a feature sensor disposed on the first circuit board; and an illuminant electrically connected to the circuit board assembly to emit light toward the light guide seat.

17. The finger feature module of claim 16, wherein the flexible printed circuit board has a slit to define a first flexible part, a second flexible part, and a bending section connected between the first flexible part and the second flexible part; the first circuit board and the second circuit board are respectively disposed on the first flexible part and the second flexible part; the flexible printed circuit board is bent relative to the slit to form the bending section.

18. The finger feature module of claim 17, wherein before the flexible printed circuit board is bent, the first flexible part has a pair of flexible wings at two opposite sides of the bending section.

19. The finger feature module of claim 16, wherein the illuminant is disposed on the flexible printed circuit board.

* * * * *